(12) United States Patent
Takenaka et al.

(10) Patent No.: US 6,611,177 B2
(45) Date of Patent: Aug. 26, 2003

(54) VOLTAGE CONTROLLED OSCILLATOR INCLUDING FLUCTUATION TRANSMITTER FOR TRANSMITTING POTENTIAL FLUCTUATION BY NOISE

(75) Inventors: Kyoichi Takenaka, Yokohama (JP); Akihiko Yoshizawa, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/003,241

(22) Filed: Dec. 6, 2001

(65) Prior Publication Data

US 2002/0067215 A1 Jun. 6, 2002

(30) Foreign Application Priority Data

Dec. 6, 2000 (JP) ......................... 2000-371781

(51) Int. Cl.[7] .............. H03B 5/04; H03B 5/24
(52) U.S. Cl. ............ 331/57; 331/177 R; 331/182; 327/281; 360/51
(58) Field of Search .............. 331/34, 57, 111, 331/116 FE, 158, 175, 177 R, 182, 183; 327/276, 281, 288; 360/51

(56) References Cited

U.S. PATENT DOCUMENTS

| | | | |
|---|---|---|---|
| 4,908,528 A | * | 3/1990 | Huang .................. 326/24 |
| 5,436,939 A | * | 7/1995 | Co et al. ................ 375/376 |
| 5,512,861 A | * | 4/1996 | Sharma ................. 331/74 |
| 5,594,391 A | | 1/1997 | Yoshizawa |
| 5,909,474 A | | 6/1999 | Yoshizawa |
| 5,955,929 A | | 9/1999 | Moon et al. |
| 6,011,444 A | | 1/2000 | Takada et al. |
| 6,177,846 B1 | | 1/2001 | Takada et al. |
| 6,271,730 B1 | * | 8/2001 | Abe et al. ............... 331/34 |
| 6,323,738 B1 | | 11/2001 | Yoshizawa et al. |

* cited by examiner

Primary Examiner—David C. Mis
(74) Attorney, Agent, or Firm—Oblon, Spivak, McClelland, Maier & Neustadt, P.C.

(57) ABSTRACT

A voltage controlled oscillator includes an oscillation controller, first and second current sources, oscillation section, and first and second fluctuation transmitters. The oscillation controller generates first and second control potentials.

The first and second current sources generate control currents corresponding to the first and second control potentials, respectively. The oscillation section is connected to a power source potential node via the first current source and connected to a ground potential node via the second current source, and generates a clock. The first fluctuation transmitter is disposed between the power source potential node and the first control potential node, and transmits a potential fluctuation in the power source potential node to the first control potential node. The second fluctuation transmitter is disposed between the ground potential node and the second control potential node, and transmits the potential fluctuation in the ground potential node to the second control potential node.

33 Claims, 13 Drawing Sheets

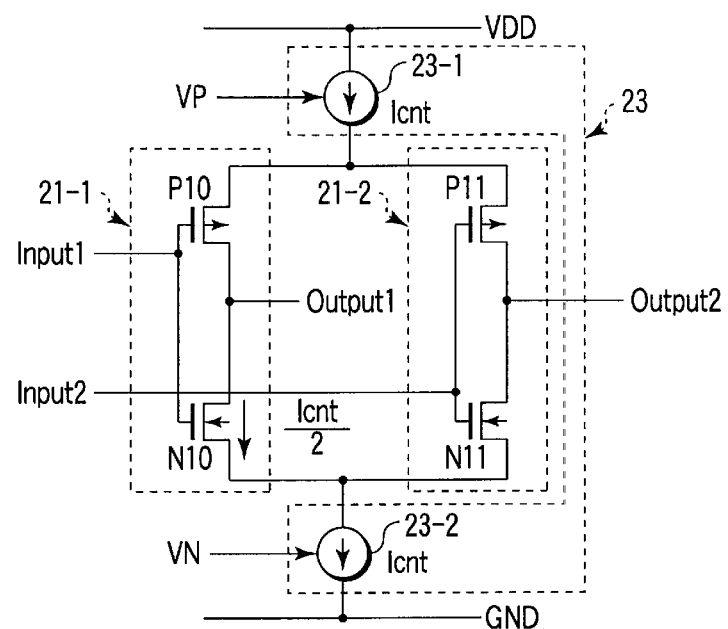
F I G. 5
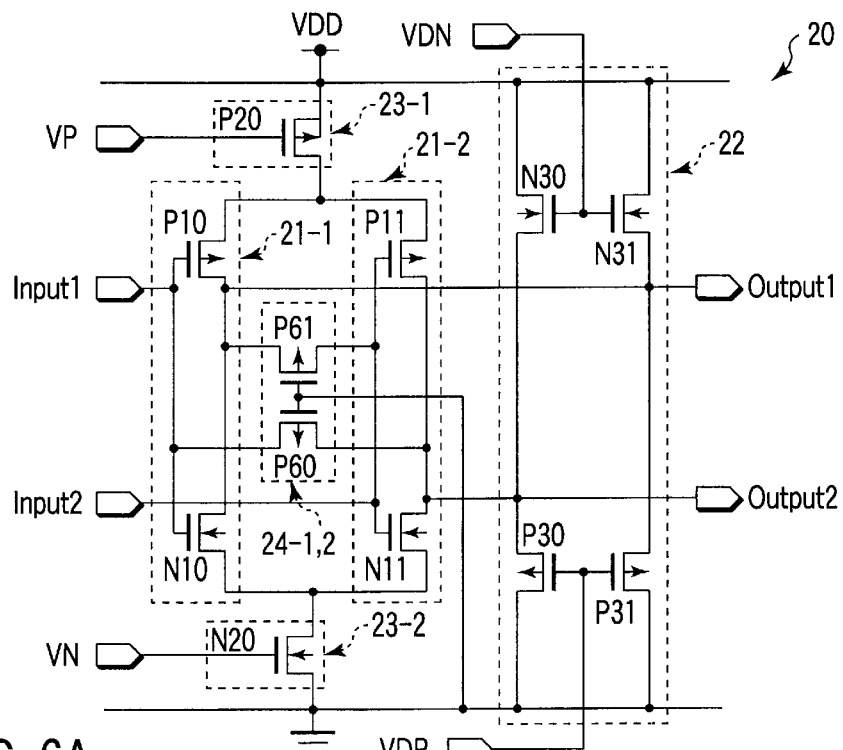
F I G. 6A

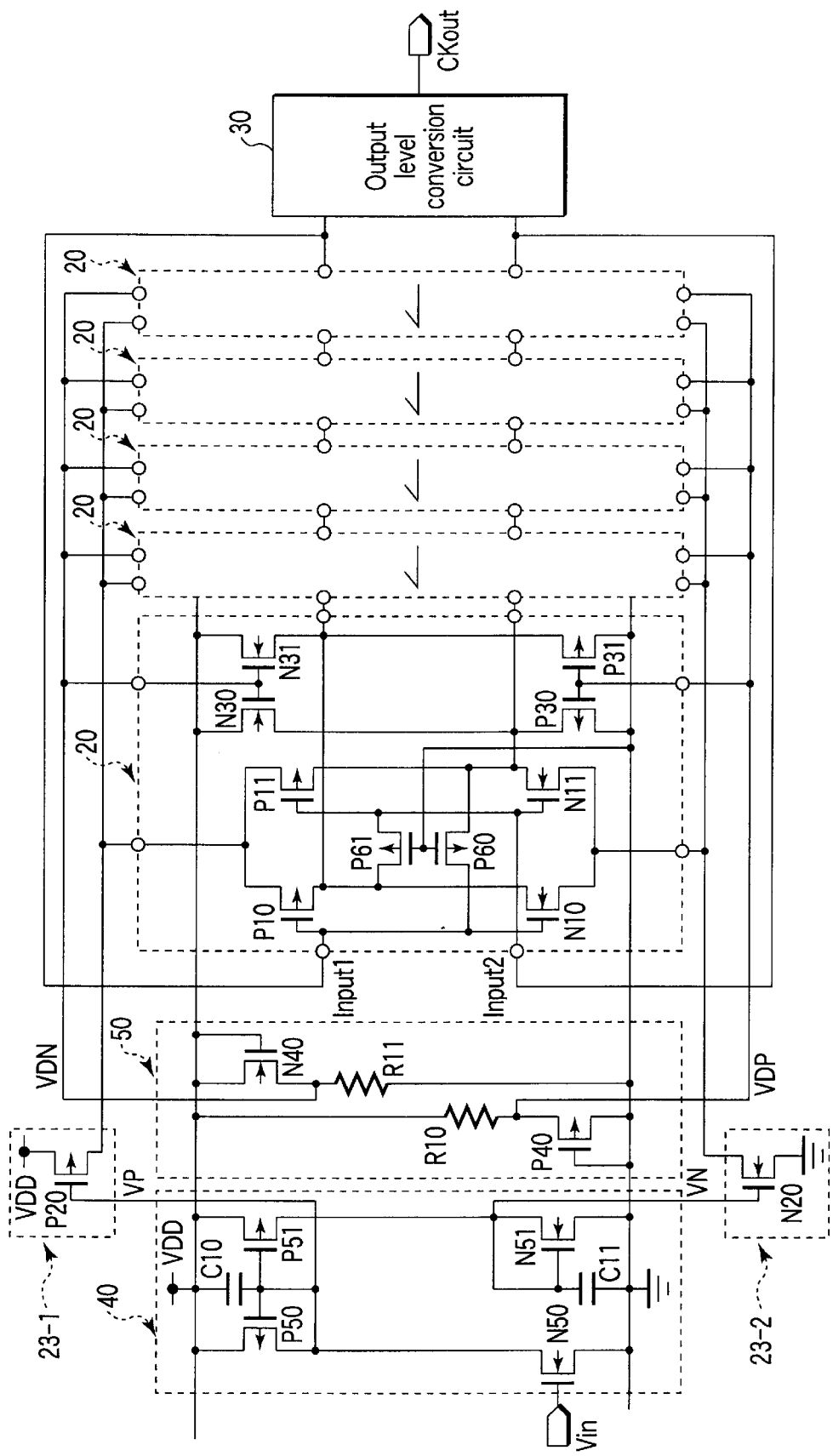
F I G. 10

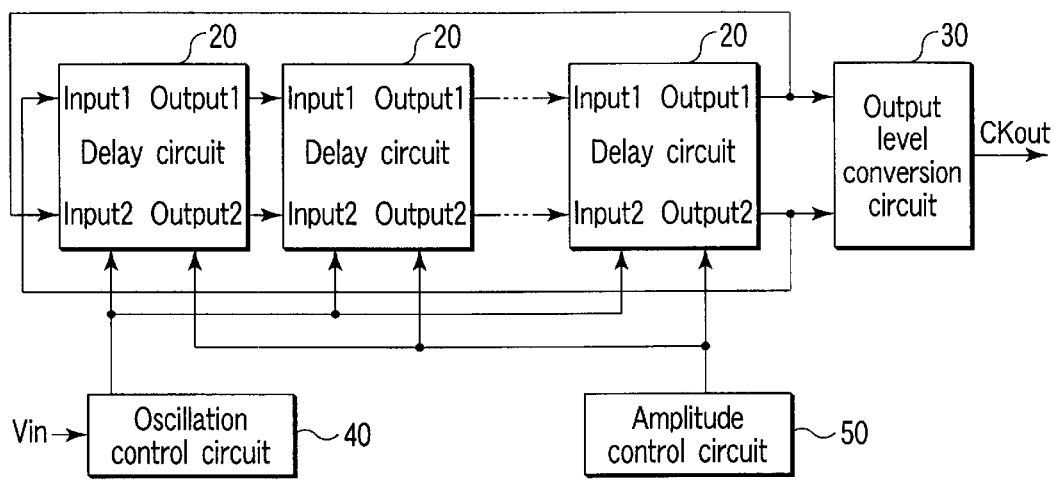
F I G. 11
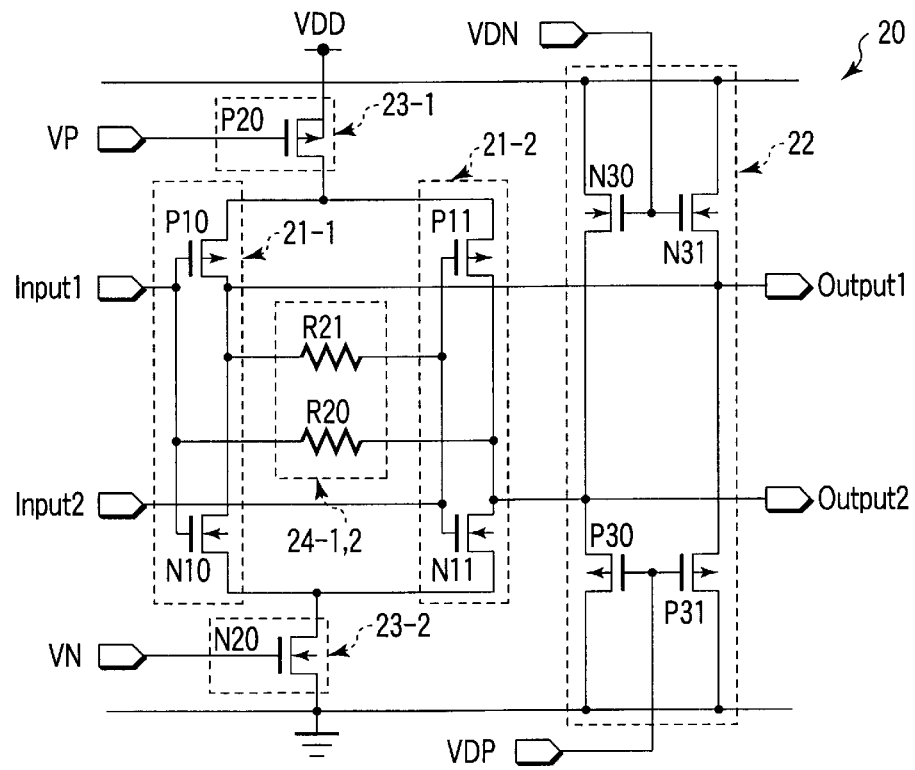
F I G. 12A

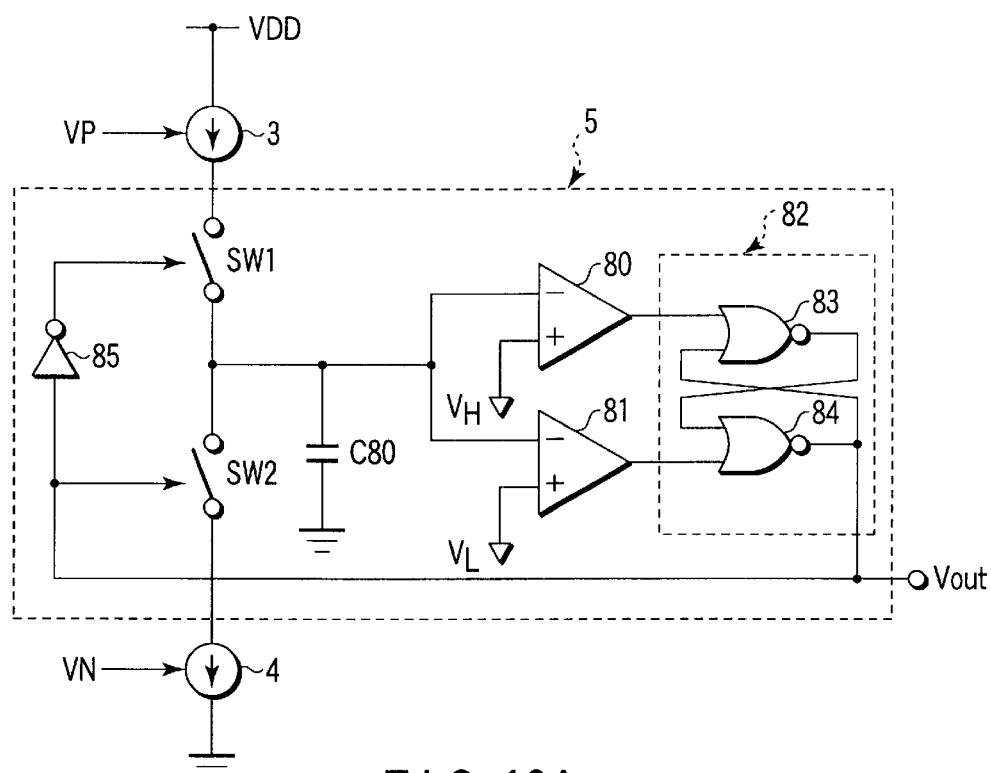
F I G. 13A
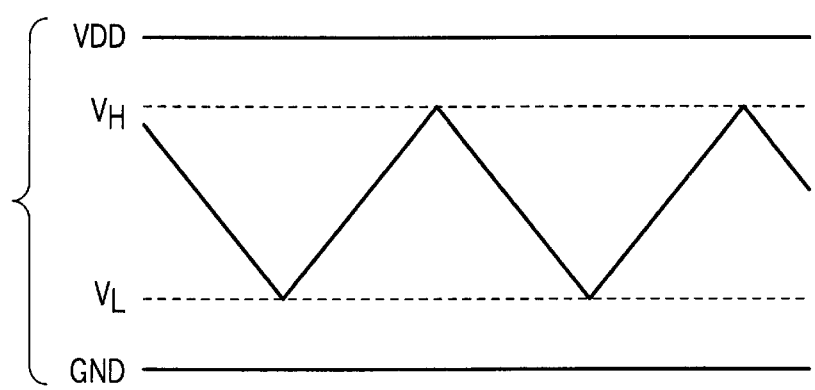
F I G. 13B

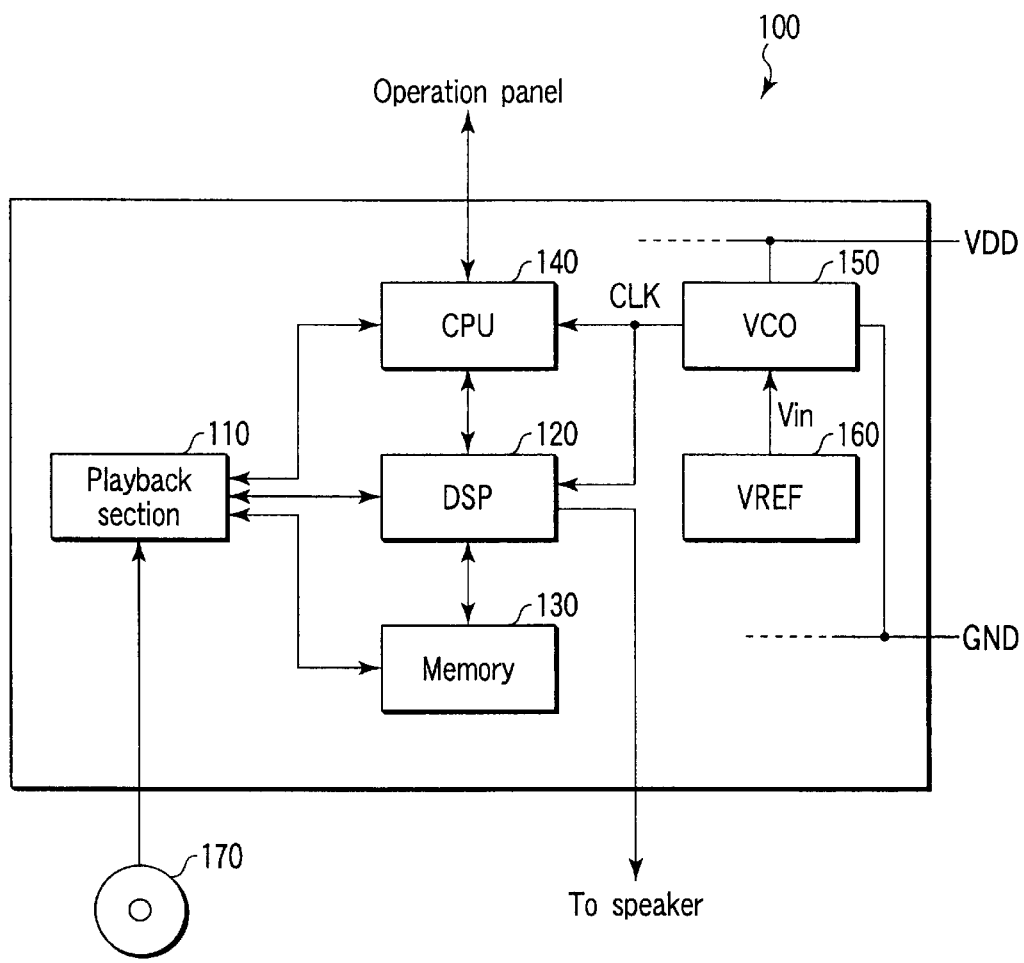
F I G. 14

VOLTAGE CONTROLLED OSCILLATOR INCLUDING FLUCTUATION TRANSMITTER FOR TRANSMITTING POTENTIAL FLUCTUATION BY NOISE

CROSS-REFERENCE TO RELATED APPLICATIONS

This application is based upon and claims the benefit of priority from the prior Japanese Patent Application No. 2000-371781, filed Dec. 6, 2000, the entire contents of which are incorporated herein by reference.

BACKGROUND OF THE INVENTION

1. Field of the Invention

The present invention relates to a semiconductor integrated circuit, particularly to a technique for stabilizing an oscillation frequency of a voltage controlled oscillator (VCO).

2. Description of the Related Art

A voltage controlled oscillator is broadly used for a purpose of generating an internal clock for driving LSI such as a microcomputer, digital signal processor (DSP), or music, movie playback system such as a compact disc (CD) or digital versatile disc (DVD).

A proposal concerning a structure of the VCO has been presented by U.S. Pat. No. 5,594,391 by Yoshizawa and U.S. Pat. No. 5,955,929 by Moon et al.

However, a voltage controlled oscillator is easily influenced by noise of a power source, and the oscillation frequency of the clock sometimes fluctuates due to this the mixed noise. The fluctuation of the oscillation frequency can cause malfunctions in a semiconductor integrated circuit such as a microcomputer, or DSP operated by the clock generated by the voltage controlled oscillator.

BRIEF SUMMARY OF THE INVENTION

A voltage controlled oscillator according to an aspect of the present invention comprises:

an oscillation controller constituted to generate first and second control potentials corresponding to an input voltage;

first and second current sources configured to generate control currents corresponding to the first and second control potentials, respectively;

an oscillation section, connected to a power source potential node via the first current source and connected to a ground potential node via the second current source, the oscillation section generating a clock whose oscillation frequency is determined by the control current;

a first fluctuation transmitter, disposed between the power source potential node and the first control potential node, the first fluctuation transmitter transmitting a potential fluctuation generated in the power source potential node to the first control potential node at the same phase and maintaining a potential difference between the power source potential and the first control potential to be constant; and a second fluctuation transmitter, disposed between the ground potential node and the second control potential node, the second fluctuation transmitter transmitting the potential fluctuation generated in the ground potential node to the second control potential node at the same phase and maintaining the potential difference between the ground potential and the second control potential to be constant.

A delay circuit according to an aspect of the present invention comprises:

first and second inverter circuits each having a power source terminal and a ground terminal, the first and second inverter circuits outputting a reverse signal of an input signal after a delay time;

a first current source, disposed between the power source terminals of the first and second inverter circuits and a power source potential node, the first current source generating a first control current, which determines the delay time, based on a first control potential applied from the outside and preventing a noise superimposed on the power source potential node from being mixed into the power source terminal;

a second current source, disposed between the ground terminals of the first and second inverter circuits and a ground potential node, the second current source generating a second control current, which determines the delay time together with the first control current, based on a second control potential applied from the outside and preventing a noise superimposed on the ground potential node from being mixed into the ground terminal;

a first fluctuation transmitter, disposed between the power source potential node and the first control potential node, the first fluctuation transmitter transmitting a potential fluctuation generated in the power source potential node to the first control potential node at the same phase and maintaining a potential difference between the power source potential and the first control potential to be constant; and a second fluctuation transmitter, disposed between the ground potential node and the second control potential node, the second fluctuation transmitter transmitting the potential fluctuation generated in the ground potential node to the second control potential node at the same phase and maintaining the potential difference between the ground potential and the second control potential to be constant.

A disc playback system according to an aspect of the present invention comprises:

a voltage controlled oscillator configured to generate an internal clock; and a semiconductor circuit configured to operate in response to the internal clock, the voltage controlled oscillator including:

an oscillation controller configured to generate first and second control potentials corresponding to an input voltage;

first and second current sources configured to generate control currents corresponding to the first and second control potentials, respectively;

an oscillation section, connected to a power source potential node via the first current source and connected to a ground potential node via the second current source, the oscillation section generating the internal clock whose oscillation frequency is determined by the control current;

a first fluctuation transmitter, disposed between the power source potential node and the first control potential node, the first fluctuation transmitter transmitting a potential fluctuation generated in the power source potential node to the first control potential node at the same phase and maintaining a potential difference between the power source potential and the first control potential to be constant; and a second fluctuation transmitter, disposed between the ground potential node and the second control potential node, the second fluctuation transmitter transmitting the potential fluctuation generated in the ground potential node to the second control potential node at the same phase and maintaining the potential difference between the ground potential and the second control potential to be constant.

BRIEF DESCRIPTION OF THE SEVERAL VIEWS OF THE DRAWING

FIG. 5 is a circuit diagram showing a part of the delay circuit according to the first embodiment of the present invention;

FIG. 6A is a circuit diagram of the delay circuit according to the first embodiment of the present invention;

FIG. 10 is a circuit diagram showing the voltage controlled oscillator according to a modification example of the first embodiment of the present invention;

FIG. 11 is a block diagram of the voltage controlled oscillator according to a second embodiment of the present invention;

FIG. 12A is a circuit diagram of the delay circuit according to a modification example of the first and second embodiments of the present invention;

FIG. 13A is a circuit diagram of an oscillation section according to a modification example of the first and second embodiments of the present invention;

FIG. 13B is a waveform diagram of an output signal of the oscillation section shown in FIG. 13A; and FIG. 14 is a block diagram of a semiconductor integrated circuit according to a third embodiment of the present invention.

DETAILED DESCRIPTION OF THE INVENTION

Figure 1:
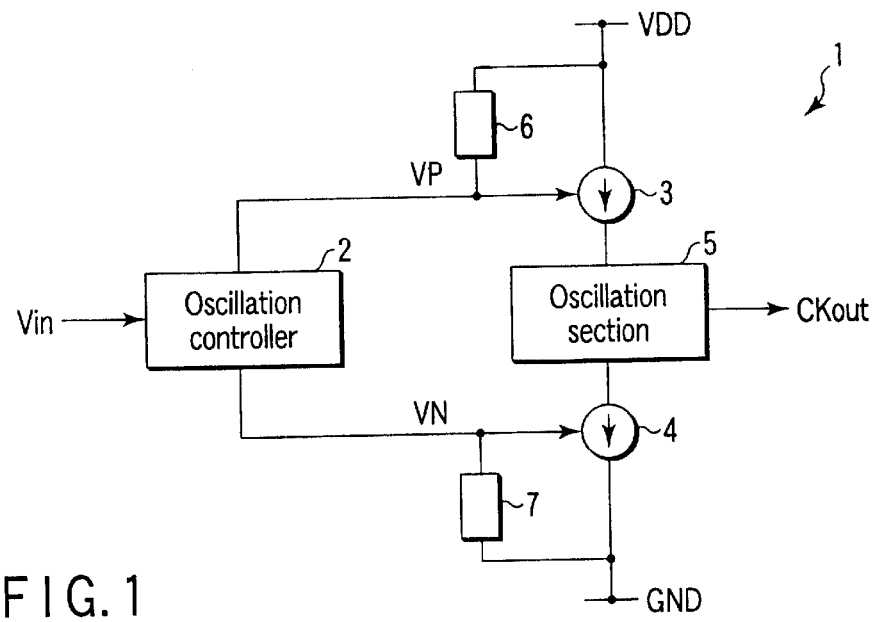
FIG. 1 is a block diagram of a voltage controlled oscillator according to a first embodiment of the present invention.

FIG. 1 is a block diagram showing a schematic constitution of a voltage controlled oscillator according to a first embodiment of the present invention.

As shown in FIG. 1, a voltage controlled oscillator 1 has an oscillation controller 2, current source 3 (first current source), current source 4 (second current source), oscillation section 5, first fluctuation transmitter 6, and second fluctuation transmitter 7.

The oscillation controller 2 generates a control voltage VP (first control potential) and control voltage VN (second control potential) based on an input voltage Vin inputted from the outside. The current sources 3, 4 supply a current based on the control voltages VP, VN generated by the oscillation controller 2. The oscillation section 5 is connected to a power source potential node (VDD node) and ground potential node (GND node) via the current sources 3, 4, respectively. Moreover, the oscillation section 5 generates an oscillation signal CKout of a frequency based on a current amount supplied by the current sources 3, 4. The first fluctuation transmitter 6 is disposed between the power source potential VDD node and a control potential VP node (VP node), and the second fluctuation transmitter 7 is disposed between the ground potential GND node and a control potential VN node (VN node).

An oscillation frequency of the oscillation signal CKout generated by the voltage controlled oscillator constituted as described above is determined by the current amounts (control current, first and second control currents) supplied by the current sources 3, 4. Moreover, the current amounts supplied by the current sources 3, 4 are determined by a potential difference between the VDD node and the VP node, and a potential difference between the GND node and the VN node.

Figure 2A:
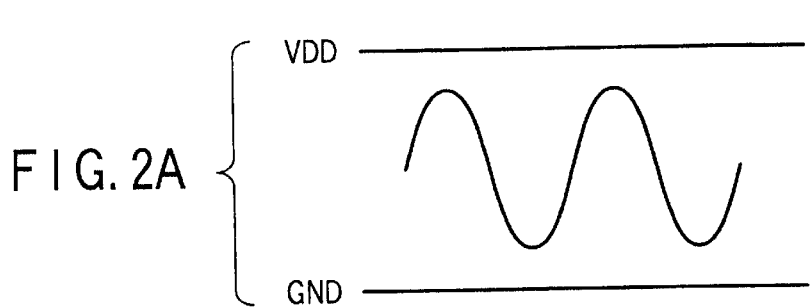
FIG. 2A is a waveform diagram of a clock outputted by the voltage controlled oscillator according to the first embodiment of the present invention.

FIG. 2A is a waveform diagram of the oscillation signal CKout. In the voltage controlled oscillator according to the present embodiment, the oscillation section 5 is sandwiched between the current sources 3 and 4. That is, the oscillation section 5 is not directly connected to the VDD node and GND node. Therefore, as shown in FIG. 2A, an amplitude of the oscillation signal is within a range of the power source potential VDD and ground potential GND. Moreover, the current source basically has a high input impedance. Therefore, even when a noise is superimposed onto the VDD node and GND node, the noise is not easily mixed into the oscillation section 5. An influence directly exerted on the oscillation signal by a noise of a power source can be reduced.

Figure 2B:
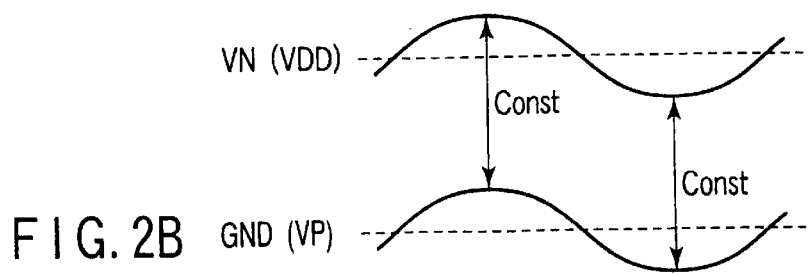
FIG. 2B is a waveform diagram of control voltages VN, VP.

Moreover, FIG. 2B is a waveform diagram of control potentials VP, VN. In the voltage controlled oscillator according to the present embodiment, the first fluctuation transmitter 6 is disposed between the VDD node and the VP node. Furthermore, the second fluctuation transmitter 7 is disposed between the GND node and the VN node. When the power source potential and ground potential fluctuate, these first and second fluctuation transmitters 6, 7 bring a change of the same phase and amount as those of a fluctuation amount into the control potential VP, VN nodes. That is, the first and second fluctuation transmitters 6, 7 are means having a function which is open with respect to a direct-current component and which is short with respect to an alternating-current component. The first and second fluctuation transmitters 6, 7 are, for example, capacitive elements. As shown in FIG. 2B, when the potential of the GND node fluctuates in a sine-wave manner due to the influence of noise or the like, the second fluctuation transmitter 7 similarly changes the potential of the VN node. As a result, even when the voltage of a ground level fluctuates, the potential difference between the ground potential GND and the control potential VN is maintained constant. The potential difference between the power source potential VDD and the control potential VP is similar. Therefore, the current values supplied by the current sources 3, 4 are constant regardless of the potential changes of the VDD node and GND node. Therefore, the oscillation frequency of the voltage controlled oscillator can be stabilized.

Figure 3:
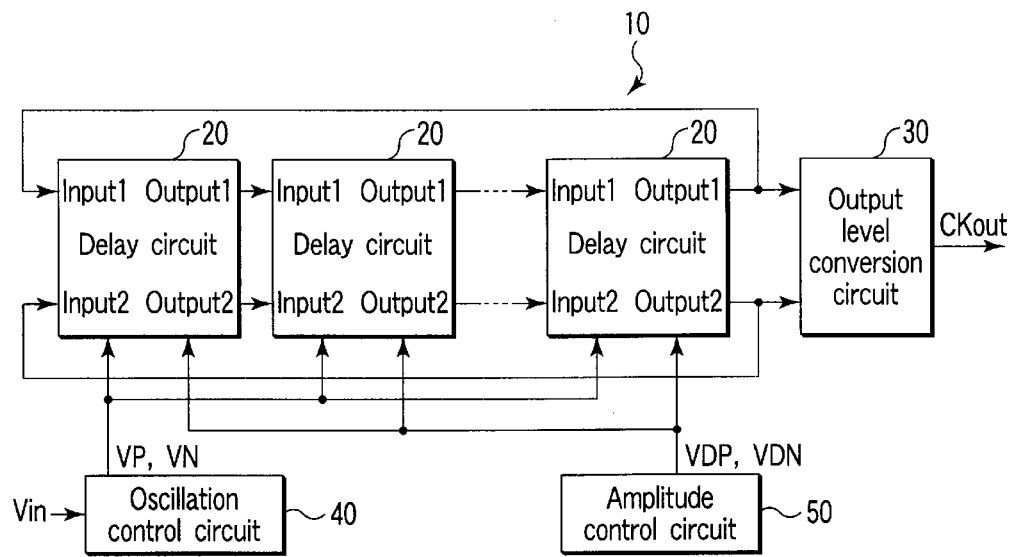
FIG. 3 is a block diagram of the voltage controlled oscillator according to the first embodiment of the present invention.

A constitution embodying the voltage controlled oscillator constituted as described above will next be described in detail. FIG. 3 is a block diagram of the voltage controlled oscillator.

As shown in FIG. 3, a voltage controlled oscillator 10 includes n (n is a natural odd number of 3 or more) delay circuits 20, 20 . . . connected in series with one another, output level conversion circuit 30, oscillation control circuit 40, and amplitude control circuit 50.

The output level conversion circuit 30 is disposed in a rear stage of the delay circuit 20 of a final stage. Moreover, the circuit outputs a clock CKout based on an output of the delay circuit of the final stage. The oscillation control circuit 40 generates control voltages VP (first control voltage) and VN (second control voltage) based on an input voltage Vin. The control voltages VP, VN are voltages for controlling the current values flowing in the respective delay circuits 20, 20, . . . In other words, an oscillation frequency fosc of the voltage controlled oscillator 10 is controlled by the control voltages VP, VN. The amplitude control circuit 50 generates control voltages VDP (third control voltage) and VDN (fourth control voltage). The control voltages VDP, VDN are voltages for controlling output amplitudes of the respective delay circuits 20, 20, . . . together with the control voltages VP, VN.

Figure 4:
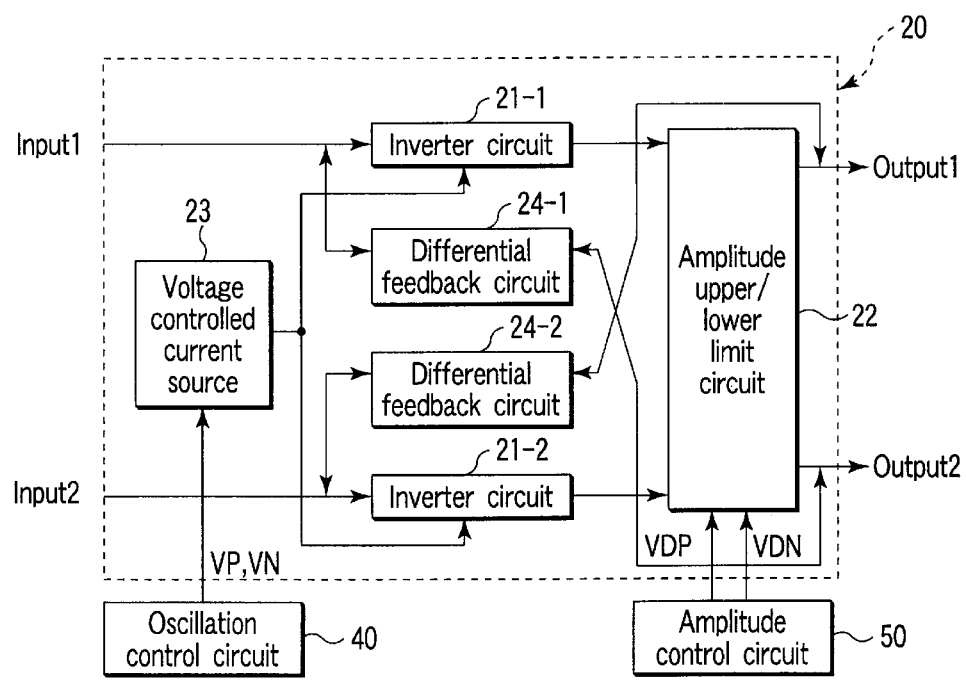
FIG. 4 is a block diagram of a delay circuit according to the first embodiment of the present invention.

FIG. 4 is a block diagram showing a schematic constitution of the delay circuit 20.

As shown in FIG. 4, the delay circuit 20 includes inverter circuits 21-1 (first inverter circuit) and 21-2 (second inverter circuit), amplitude upper/lower limit circuit 22, voltage controlled current source 23, and differential feedback circuits 24-1 (first differential feedback circuit) and 24-2 (second differential feedback circuit).

The inverter circuits 21-1, 21-2 output reverse signals of input signals inputted into input nodes 1, 2, respectively, after a given delay time. The input signals inputted into the input nodes 1, 2 are in a relation of an opposite phase.

The amplitude upper/lower limit circuit 22 limits output signals of the inverter circuits 21-1, 21-2 so that upper and lower limits of an amplitude of each output signal are within a certain range. The range is determined by control voltages VDP (third control potential) and control voltage VDN (fourth control potential) outputted by the amplitude control circuit 50. Moreover, the signals subjected to amplitude control are outputted via output nodes 1, 2, respectively.

The voltage controlled current source 23 supplies currents to the inverter circuits 21-1, 21-2. Delay times of the inverter circuits 21-1, 21-2 are controlled by the current supplied by the voltage controlled current source 23. The current supplied by the voltage controlled current source is controlled by the control voltages VP, VN outputted by the oscillation control circuit 40.

The differential feedback circuits 24-1, 24-2 control voltages so that the voltages of the input node 1 and output node 2, or the voltages of the input node 2 and output node 1 constantly have the same phase and substantially the same potential. That is, the differential feedback circuit 24-1 maintains a state in which a phase of the voltage of the output node 1 deviate by 180° from a phase of the voltage of the output node 2, the differential feedback circuit 24-2 maintains a state in which a phase of the voltage of the output node 2 deviate by 180° from the output node 1. The differential feedback circuits 24-1, 24-2 are required to mutually and differentially operate the inverter circuits 21-1, 21-2 which independently operate.

Constitutions of the inverter circuits 21-1, 21-2, and a connection relation with the voltage controlled current source 23 will be described with reference to FIG. 5. FIG. 5 is a circuit diagram of the inverter circuit and voltage controlled current source.

As shown in FIG. 5, the voltage controlled current source 23 includes a current source circuit 23-1 (first current source) and current source circuit 23-2 (second current source). The current source circuit 23-1 has one end connected to the VDD node, and the other end connected to power source terminals of the inverter circuits 21-1, 21-2. The current source circuit 23-2 has one end connected to ground terminals of the inverter circuits 21-1, 21-2, and the other end connected to the GND node. The current source circuit 23-1 supplies a control current Icnt determined by the control voltage VP. The current source circuit 23-2 supplies the control current Icnt determined by the control voltage VN.

The inverter circuit 21-1 includes a pMOS transistor P10 and nMOS transistor N10. The pMOS transistor P10 has a gate connected to the input node 1, a source connected to the other end of the current source circuit 23-1, and a drain. The nMOS transistor N10 has a gate connected to the input node 1, a source connected to one end of the current source circuit 23-2, and a drain connected to the drain of the pMOS transistor P10. Moreover, a connection node of the drain of the pMOS transistor P10 with the drain of the nMOS transistor N10 is the output node 1 of the inverter circuit 21-1.

The inverter circuit 21-2 includes a pMOS transistor P11 and nMOS transistor N11. The pMOS transistor P11 has a gate connected to the input node 2, a source connected to the other end of the current source circuit 23-1, and a drain. The nMOS transistor N11 has a gate connected to the input node 2, a source connected to one end of the current source circuit 23-2, and a drain connected to the drain of the pMOS transistor P11. Moreover, a connection node of the drain of the pMOS transistor P11 with the drain of the nMOS transistor N11 is the output node 2 of the inverter circuit 21-2.

As described above, the inverter circuits 21-1, 21-2 are set between the current source circuits 23-1, 23-2. That is, the inverter circuits 21-1, 21-2 are disposed between the power source potential VDD and the ground potential GND via the current source circuits 23-1, 23-2. Moreover, when the potential of the input node 1 is the same as the potential of the input node 2, a current of Icnt/2 is supplied to the respective inverter circuits 21-1, 21-2.

The delay circuit 20 embodying the current source circuits (voltage controlled current source 23) 23-1, 23-2, amplitude upper/lower limit circuit 22, and differential feedback circuits 24-1, 24-2 will next be described with reference to FIG. 6A. FIG. 6A is a circuit diagram of the delay circuit.

As shown in FIG. 6A, a pMOS transistor P20 (third MOS transistor) constitutes the current source circuit 23-1. The pMOS transistor P20 has a gate applied with the control voltage VP, a source connected to the VDD node, and a drain connected to the sources of the pMOS transistors P10, P11. Moreover, an nMOS transistor N20 (fourth MOS transistor) constitutes the current source circuit 23-2. The nMOS transistor N20 has a gate applied with the control voltage VN, a source connected to the GND node, and a drain connected to the sources of the nMOS transistors N10, N11.

A pMOS transistor P60 (first MOS transistor) constitutes the differential feedback circuit 24-1. The pMOS transistor P60 has a gate connected to the GND node, a drain connected to the input node 1, and a source connected to the output node 2. Moreover, a pMOS transistor P61 (second MOS transistor) constitutes the differential feedback circuit 24-2. The pMOS transistor P61 has a gate connected to the GND node, a drain connected to the input node 2, and a source connected to the output node 1.

The amplitude upper/lower limit circuit 22 includes: nMOS transistors N30, N31 having gates applied with the control voltage VDN outputted by the amplitude control circuit 50, drains connected to the VDD node, and sources; and pMOS transistors P30, P31 having gates applied with the control voltage VDP outputted by the amplitude control circuit 50, drains connected to the GND node, and sources connected to the sources of the nMOS transistors N30, N31. Additionally, the connection node of the source of the nMOS transistor N31 and the source of the pMOS transistor P31 is connected to the output node 1, and the connection node of the source of the nMOS transistor N30 and the source of the pMOS transistor P30 is connected to the output node 2.

Figure 6B:
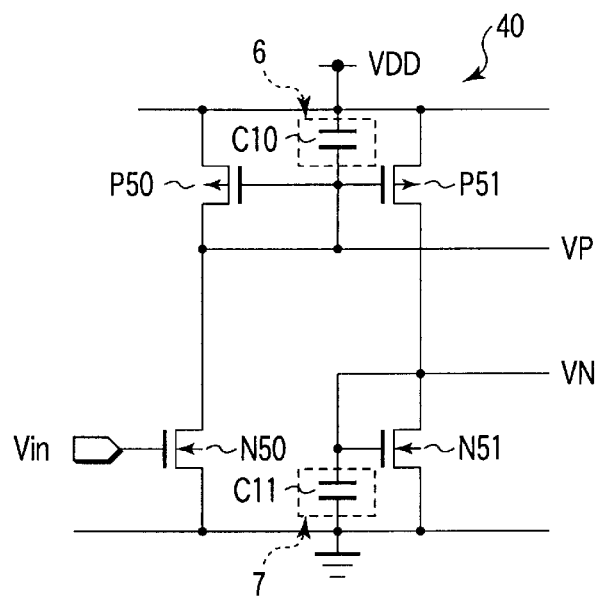
FIG. 6B is a circuit diagram of an oscillation control circuit according to the first embodiment of the present invention.

A concrete constitution of the oscillation control circuit 40 which outputs the control voltages VN and VP for controlling the voltage controlled current source 23 will next be described with reference to FIG. 6B. FIG. 6B is a circuit diagram of the oscillation control circuit.

As shown in FIG. 6B, the oscillation control circuit 40 includes nMOS transistors N50, N51, pMOS transistors P50, P51, and capacitor elements C10, C11. The capacitor elements C10, C11 correspond to the first and second fluctuation transmitters 6, 7 in FIG. 1, respectively.

The nMOS transistor N50 has a gate applied with the input voltage Vin, a source connected to the GND node, and a drain connected to the drain of the pMOS transistor P50. The nMOS transistor N51 has a gate connected to the GND node via the capacitor element C11, a source connected to the GND node, and a drain connected to the drain of the pMOS transistor P51. The pMOS transistor P50 has a gate connected to the VDD node via the capacitor element C10, a source connected to the VDD node, and a drain. The pMOS transistor P51 has a gate connected to the gate of the pMOS transistor P50, a source connected to the VDD node, and a drain. Moreover, the connection node of the gate of the pMOS transistor P50 and the gate of the pMOS transistor P51 is connected to the drain of the pMOS transistor P50. Furthermore, the connection node of the drain of the nMOS transistor N51 and the drain of the pMOS transistor P51 is connected to the gate of the nMOS transistor N51. Additionally, the drain of the pMOS transistor P50 is the VP node, and the drain of the nMOS transistor N51 is the VN node.

Figure 6C:
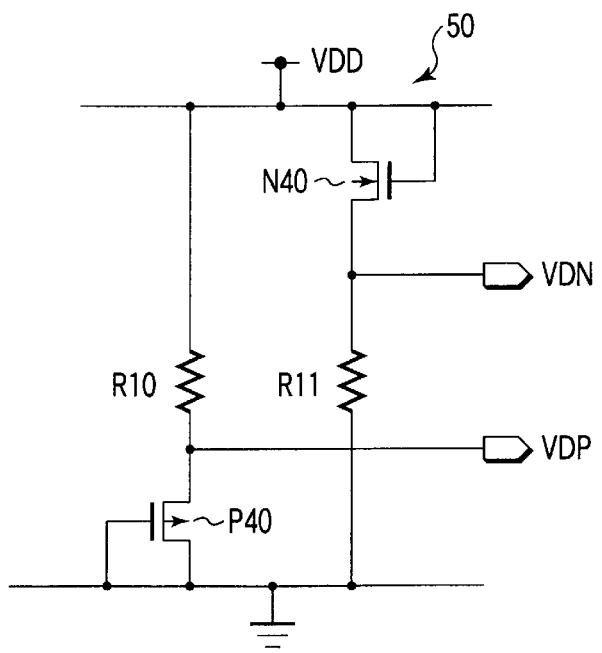
FIG. 6C is a circuit diagram of an amplitude control circuit according to the first embodiment of the present invention.

A concrete constitution of the amplitude control circuit 50 which generates the control voltages VDN and VDP for controlling the amplitude upper/lower limit circuit 22 will next be described with reference to FIG. 6C. FIG. 6C is a circuit diagram of the amplitude control circuit.

As shown in FIG. 6C, the amplitude control circuit 50 includes a pMOS transistor P40 (fifth MOS transistor), nMOS transistor N40 (sixth MOS transistor), resistance element R10 (third resistance element), and resistance element R11 (fourth resistance element).

The pMOS transistor P40 has a gate/drain connected to the GND node, and a source. The nMOS transistor N40 has a gate/drain connected to the VDD node, and a source. The resistance element R10 has one end connected to the VDD node, and the other end connected to the source of the pMOS transistor P40. The resistance element R11 has one end connected to the GND node, and the other end connected to the source of the nMOS transistor N40. Moreover, the connection node of the source of the nMOS transistor N40 and the other end of the resistance element R11 is the control potential VDN node, and the connection node of the source of the pMOS transistor P40 and the other end of the resistance element R10 is the control potential VDP node.

Figure 7:
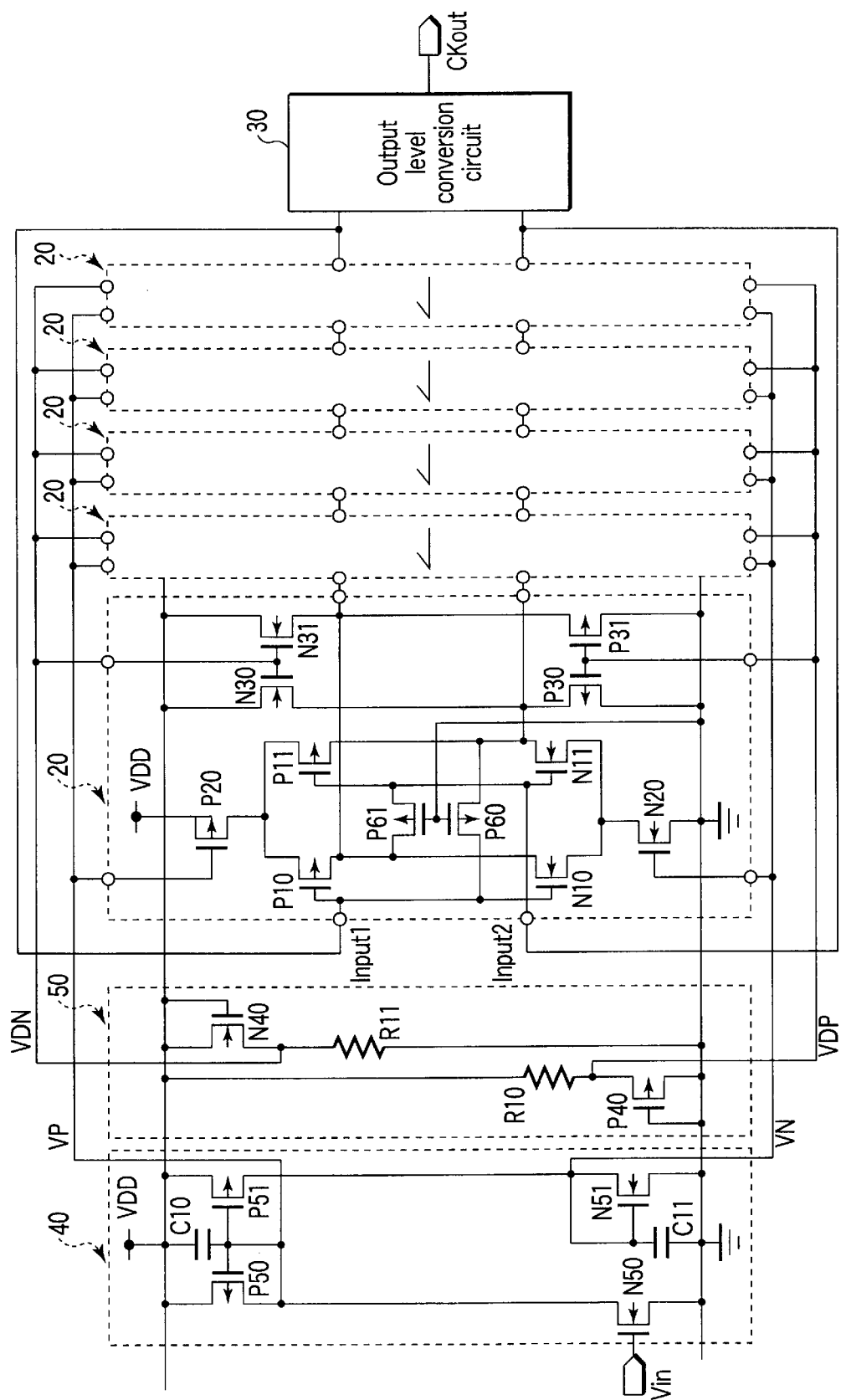
FIG. 7 is a circuit diagram of the voltage controlled oscillator according to the first embodiment of the present invention.

FIG. 7 is a circuit diagram of the voltage controlled oscillator of FIG. 3 constituted using the respective circuits of FIGS. 6A to 6C.

Figure 8A:
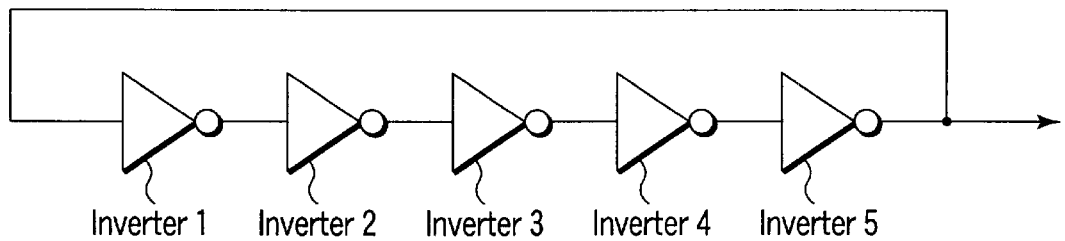
FIG. 8A is an equivalent circuit diagram of the voltage controlled oscillator according to the first embodiment of the present invention.
Figure 8B:
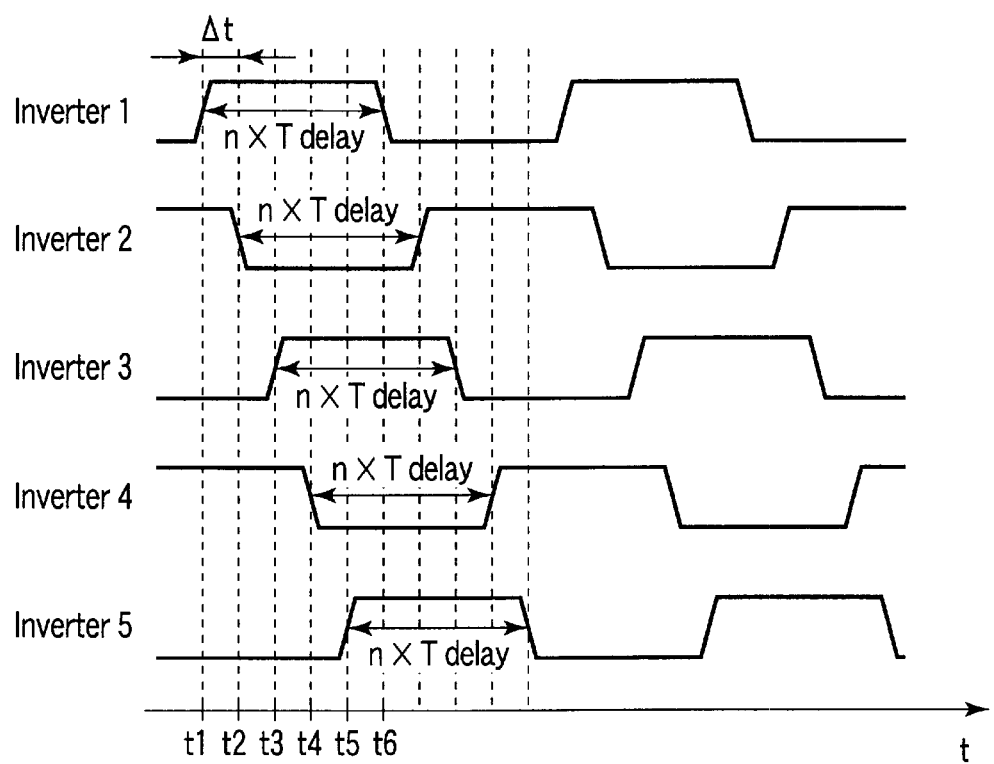
FIG. 8B is a waveform diagram of an inverter output shown in FIG. 7.

An operation of the voltage controlled oscillator 10 shown in FIG. 7 will next be described. Here, it is assumed that each of the delay circuits 20, 20, . . . is a simple inverter, and five stages of delay circuits are disposed. An equivalent circuit of the voltage controlled oscillator assumed in this manner is shown in FIG. 8A. Moreover, FIG. 8B shows a change of an output level of each inverter shown in FIG. 8A with time, and is a waveform diagram of inverter outputs of first to fifth stages.

First, it is assumed that an inverter 2 outputs the reverse signal of the input signal at time t1. Then, the inverter 2 outputs the reverse signal of an output of an inverter 1 at time t2 delayed from time t1 by Δt. Subsequently, an inverter 3 outputs the reverse signal of the output of the inverter 2 at time t3 further delayed from time t2 by Δt. Furthermore, an inverter 4 outputs the reverse signal of the output of the inverter 3 at time t4 further delayed from time t3 by Δt. Additionally, an inverter 5 of the final stage outputs the reverse signal of the output of the inverter 4 at time t5 delayed from time t4 by Δt. Then, the inverter 1 reverses the output signal at time t6 delayed from time t5 by Δt.

That is, a time T1 required for the signal inputted into the inverter of an initial stage to return to the inverter of the initial stage through n inverters (n is a natural odd number of 3 or more) is equal to n×Tdelay. Tdelay represents a delay time Δt in each inverter. Moreover, each inverter repeats the reversing of the output signal at a time interval T1. That is, a repetition frequency of each of n inverters connected in series is (1/2n·Tdelay).

Figure 8C:
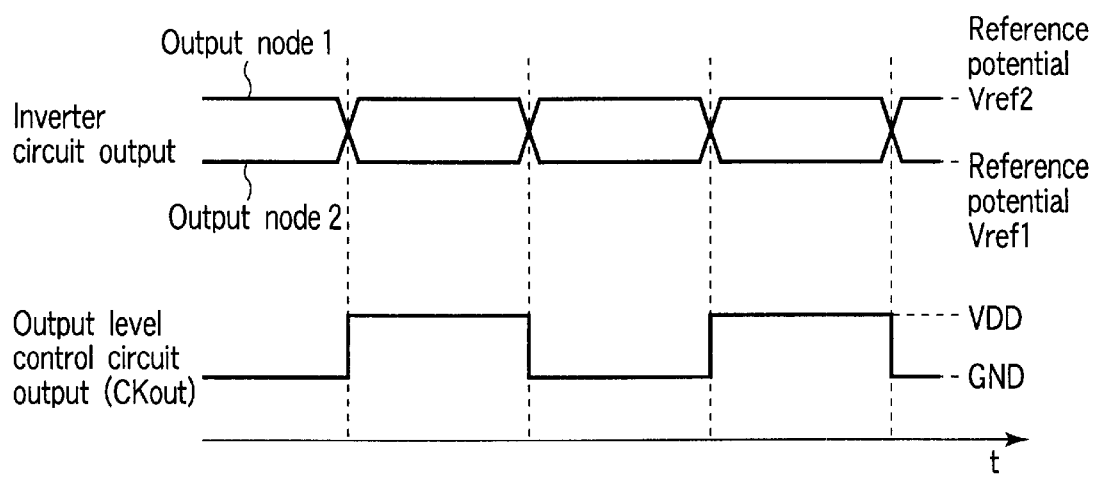
FIG. 8C is a waveform diagram of the inverter output and clock in the voltage controlled oscillator shown in FIG. 3.

The delay circuit according to the present embodiment is a differential delay circuit including two inverter circuits 21-1, 21-2. Therefore, as shown in a waveform diagram of FIG. 8C, outputs of the inverter circuits 21-1, 21-2 are synchronized with each other, and a reversing operation is repeated at a period of (1/2n·Tdelay) in an opposite phase. The output level of the delay circuit 20 is a small amplitude output ranging from a constant reference potential Vref1 to a reference potential Vref2 which is lower than the power source potential VDD and higher than the reference potential Vref1. As shown in the waveform diagram of FIG. 8C, the output level conversion circuit 30 converts the amplitudes of the output signals (signals of output nodes 1, 2) of the inverter circuits 21-1, 21-2 to an amplitude of a CMOS level. As a result, the output signal of the output level conversion circuit 30 ranges from the ground potential GND to the power source potential VDD, and is an output CKout of the voltage controlled oscillator 10.

An oscillation frequency fosc of the voltage controlled oscillator 10 is determined by the delay time Tdelay. The delay time Tdelay is controlled by the voltage controlled current source 23. As shown in FIG. 5, the current source circuits 23-1, 23-2 constituting the voltage controlled current source 23 supply respective control currents Icnt. Since the inverter circuits 21-1, 21-2 perform a differential operation, each of current values flowing through the inverter circuits 21-1, 21-2 is Icnt/2. Moreover, when each transistor constituting the inverter circuits 21-1, 21-2 operates in a saturated region, a current gain gm of the inverter circuits 21-1, 21-2 with respect to an input capacity Cin of the inverter circuit of the next stage is proportional to the square root of the control current Icnt. The delay time Tdelay of the delay circuit is determined by a time necessary for charging or discharging the input capacity Cin. Moreover, the time required for charging/discharging is inversely proportional to the current gain gm. Therefore, the delay time Tdelay is inversely proportional to the square root of the control current Icnt. That is, the delay time Tdelay can be controlled by the control current Icnt, and the oscillation frequency fosc of the voltage controlled oscillator 10 can thereby be controlled.

The value of the control current Icnt is determined by the control voltages VP, VN, and the control voltages VP, VN are controlled by the oscillation control circuit 40.

The input voltage Vin for determining the oscillation frequency fosc of the voltage controlled oscillator 10 is inputted into the oscillation control circuit 40 (see FIG. 6B) from the outside. Moreover, the oscillation control circuit 40 generates the control voltages VP, VN based on the input voltage Vin and supplies the voltages to the gates of the pMOS transistor P20 and nMOS transistor N20. By the control voltages VP, VN, the currents supplied by the pMOS transistor P20 and nMOS transistor N20 constantly become equal. Moreover, the control voltages VP, VN are set so that the control current Icnt supplied by the pMOS transistor P20 and nMOS transistor N20 is proportional to the square of the input voltage Vin. This is because the delay time Tdelay is proportional to the square root of the control current Icnt. Therefore, when the control current Icnt is set to be proportional to the square of the input voltage Vin, the delay time Tdelay becomes inversely proportional to the input voltage Vin. As a result, since the oscillation frequency fosc is proportional to an inverse number of the delay time Tdelay, the frequency is proportional to the input voltage Vin.

An operation of the amplitude upper/lower limit circuit 22 disposed in the rear stage of the inverter circuits 21-1, 21-2 will next be described with reference to FIG. 6A.

In the amplitude upper/lower limit circuit 22, the control voltage VDN is inputted into the gates of the nMOS transistors N30, N31 which determine lower limits of output amplitudes of the inverter circuits 21-1, 21-2. Moreover, the control voltage VDP is inputted into the gates of the pMOS transistors P30, P31 which determine upper limits of amplitudes of the inverter circuits 21-1, 21-2. Furthermore, the control voltage VDN controls a lower limit value of the output amplitude of the inverter circuits 21-1, 21-2, and the control voltage VDP controls an upper limit value thereof.

For example, when an output potential of the inverter circuit 21-1 (source potential of the pMOS transistor P31) is high, and a potential difference between the gate potential VDP and the source potential of the pMOS transistor P31 becomes higher than a threshold value of the pMOS transistor P31, the pMOS transistor P31 has an ON state. Then, the potential of the output terminal of the inverter circuit 21-1 depends on resistance of the pMOS transistor P31, and the voltage VGS between the gate and the source is constant. This also applies to a case in which the output potential of the inverter circuit 21-2 (source potential of the pMOS transistor P30) becomes high.

Conversely, when the output potential of the inverter circuit 21-1 (source potential of the nMOS transistor N31) is low, and the potential difference between the gate potential VDN and the source potential of the nMOS transistor N31 reaches a level higher than the threshold value, the nMOS transistor N31 has an ON state. Then, the potential of the output terminal of the inverter circuit 21-1 depends on the nMOS transistor N31, the potential (VDN-VGS) becomes constant, VGS represents the voltage between the gate and the source. This also applies to a case in which the output potential of the inverter circuit 21-2 (source potential of the nMOS transistor N30) becomes low.

As shown in FIG. 6C, the amplitude control circuit 50 for supplying the control voltages VDN, VDP sets the control voltages VDN, VDP based on voltage current characteristics of the pMOS transistor P40 and nMOS transistor N40 and resistance values of resistance elements R10 and R11.

An operation of the differential feedback circuits 24-1, 24-2 will next be described (see FIG. 6A).

For example, it is assumed that the potential of the input node 1 of the inverter circuit 21-1 is higher than the potential of the output node 2 of the inverter circuit 21-2. Since the gate of the pMOS transistor P61 is connected to the ground potential node and has a sufficiently low potential, the transistor P61 constantly has an ON state. Then, the current flows into the output node of the inverter circuit 21-2 from the input node of the inverter circuit 21-1. That is, feedback operates so that both the nodes have substantially the same potential. This also applies to the pMOS transistor P60. As a result, the inverter circuits 21-1, 21-2 is controlled so that a reverse state is mutually held. Additionally, the gates of the pMOS transistors P60, P61 are connected to the ground potential, but may be connected to the node having a low potential so that the ON state can be secured, instead of the ground potential. Of course, instead of the pMOS transistor, the circuit may be constituted by the nMOS transistor.

According to the voltage controlled oscillator constituted as described above, the current source circuits 23-1, 23-2 are constituted to hold the delay circuit 20 therebetween. That is, the inverter circuits 21-1, 21-2 are connected to the power source potential VDD and ground potential GND via the current source circuits 23-1, 23-2. Moreover, as described above, the current source circuit has an ideally infinite output impedance. Therefore, the inverter circuits 21-1, 21-2 are hardly influenced by the noise of the power source. The operation reliability of the voltage controlled oscillator can therefore be enhanced.

Moreover, the voltage controlled oscillator has the amplitude upper/lower limit circuit disposed in the rear stage of the inverter circuits 21-1, 21-2. Therefore, it is possible to constantly stabilize the output level of the inverter circuits 21-1, 21-2. Moreover, even when the oscillation frequency is high, the amplitude upper/lower limit circuit prevents the voltage level of the oscillation signal from reaching the power source potential or the ground potential. Therefore, in the voltage controlled oscillator, it is possible to generate a clock which is not easily influenced by the noise.

Furthermore, in the present embodiment, the current source circuit is constituted by a MOS transistor. When the current source circuit maintains a high output impedance in order to inhibit mixture of a power source noise, the MOS transistor constituting the current source circuit needs to operate in a saturated region. For example, when the output potential of the inverter circuit 21-1 is raised, and the voltage between the drain and the source of the pMOS transistor P20 is lowered, the operation region of the pMOS transistor P20 shifts to a linear region from the saturated region. Since the output impedance of the MOS transistor operating in the linear region is very small, the inverter circuits 21-1, 21-2 are easily influenced by the power source system noise via the pMOS transistor P20. This also applies to the ground potential. However, in the constitution according to the present embodiment, the amplitude upper/lower limit circuit suppresses the amplitudes of the inverter circuits 21-1, 21-2 within a fixed range. Therefore, it is possible to maintain the saturated region operation having the high output impedance in the pMOS transistor P20 and nMOS transistor N20.

Moreover, the voltage controlled oscillator according to the present embodiment has the amplitude control circuit 50 for supplying control potentials VDN, VDP to the amplitude upper/lower limit circuit (see FIG. 6C). Therefore, a change of delay time caused by a temperature change can be prevented.

Figure 9:
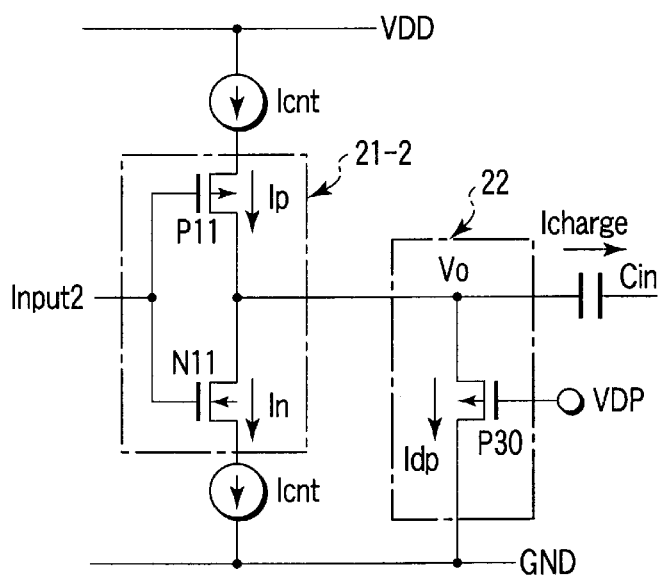
FIG. 9 is a circuit diagram showing a part of the voltage controlled oscillator according to the first embodiment of the present invention.

This respect will be described with reference to FIG. 9. FIG. 9 is a circuit diagram showing a part of the inverter circuit 21-2 and amplitude upper/lower limit circuit 22. The potential change of the output node of a time at which the input level of the inverter circuit 21-2 rises will be described.

A time required for the rising of potential of output node of the inverter circuit 21-2 depends on the speed at which the input capacity Cin of the inverter circuit of the next stage is charged. It is assumed that a magnitude of the output amplitude is small enough to satisfy a condition of Vo<VDP+Vth (Vo represents the output potential of the inverter circuit 21-2, Vth represents a threshold voltage of the pMOS transistor P30). In this case, the pMOS transistor P30 is in an OFF state.

It is next assumed that the output amplitude is enlarged, the condition of Vo>VDP+Vth is satisfied, and the pMOS transistor P30 is brought to the ON state. Furthermore, while the pMOS transistor P30 is in the ON state, the output potential Vo is increased. Then, a most part of a current Icharge with which the input capacity Cin has been charged starts to flow into the pMOS transistor P30 (current Idp). As a result, the charge current Icharge is reduced, and the delay time Tdelay is lengthened. On the other hand, when the control potential VDP becomes large, the current gain gm is increased, and the delay time Tdelay is shortened.

For example, when an ambient temperature rises, the operation causes the following phenomenon. In the delay circuit 20, when the temperature rises, the current gain gm of the transistor is generally lowered, the charge current is reduced, and the delay time Tdelay is lengthened.

On the other hand, also in the amplitude control circuit 50, when the temperature rises, the current gain gm of the transistor drops. Therefore, the current supply amount of the pMOS transistor P40 in FIG. 6C decreases. Then, a voltage drop in the resistance element R10 decreases, and the control potential VDP therefore rises. As described above, the rise of the control voltage VDP results in a shortening of the delay time Tdelay.

That is, the rise of the temperature contributes in a direction in which the delay time Tdelay is lengthened in each delay circuit 20. However, a temperature rise contributes in a direction in which the control voltage VDP is raised in the amplitude control circuit 50. As a result, the lengthening of the delay time Tdelay in each delay circuit is offset by the shortening of the delay time Tdelay by the rise of the control voltage VDP. Therefore, it is possible to inhibit the change of the delay time by the temperature.

Furthermore, in the oscillation control circuit 40 in the voltage controlled oscillator constituted as described above, the capacitor element C10 is disposed as the first fluctuation transmission means 6 between the gates of the pMOS transistors P50, P51 and the VDD node (see FIG. 6B). Therefore, for example, when the power source noise is mixed into the VDD node, the potential change having the same phase as that of the power source noise is also applied to the VP node. As a result, the potential difference between the VDD node and the VP node for controlling the current source circuit 23-1 is not easily influenced by the noise.

Similarly, the capacitor element C11 is disposed as the second fluctuation transmission means 7 between the gates of the nMOS transistors N50, N51 and the GND node. Therefore, when the power source noise is mixed into the GND node, the potential change having the same phase as that of the power source noise is also applied to the VN node. As a result, the potential difference between the ground potential GND and the control potential VN is not easily influenced by the noise. Therefore, the pMOS transistor P20 and nMOS transistor N20 constituting the current source circuits 23-1, 23-2 can supply a stable current against the noise.

In other words, noise countermeasures in the voltage controlled oscillator according to the present embodiment include:

connecting the inverter circuit in the delay circuit to the power source potential VDD and ground potential GND via the current source circuit having a very large output impedance;

changing the control potential for controlling the current amount of the current source circuit in cooperation with the power source potential VDD and ground potential, and holding the potential difference between both the potentials to be constant; and constituting the delay circuit by two inverter circuits which perform differential operations. This realizes a stable operation with respect to the noise of the voltage controlled oscillator.

Furthermore, when the voltage controlled oscillator according to the present embodiment is applied to a phase locked loop (PLL), the oscillation frequency of the voltage controlled oscillator is substantially proportional to the input voltage. Therefore, a loop characteristic of the PLL becomes constant, and it becomes easy to stabilize the output frequency of the PLL.

Moreover, it is usual to dispose a loop filter in a previous stage of the voltage controlled oscillator in the constitution of the PLL. That is, the capacitor element exists between the node to which the input voltage Vin of the voltage controlled oscillator is inputted, and the ground potential. Since the capacity of the capacitor element is relatively large, the impedance is low in a high frequency band, and an input voltage Vin node is largely influenced by the power source system noise. However, in the present oscillation control circuit, the nMOS transistor N50 for converting the input voltage to the current, comprises the gate connected to the input voltage Vin, and the source connected to the ground potential. Therefore, even when the noise is mixed, the potential difference between the input voltage Vin and the ground potential is unchanged. As a result, a drain current is stable, and it is also possible to supply the stable control voltages VP, VN.

FIG. 10 is a circuit diagram showing the voltage controlled oscillator according to a modification example of the present embodiment. As shown in FIG. 10, the current source circuits 23-1, 23-2 are disposed in common to all the delay circuits 20, 20, in the present voltage controlled oscillator 10. Even if this constitution is used, an effect similar to that of the aforementioned embodiment is obtained.

The delay circuit and voltage controlled oscillator according to a second embodiment of the present invention will next be described with reference to FIG. 11. FIG. 11 is a circuit diagram of the voltage controlled oscillator. For the second embodiment, the number of delay circuits is an even number in the first embodiment.

As shown in FIG. 11, in order to realize an oscillator by an even number of delay circuits, the output node 1 of the delay circuit of the final stage is connected to the input node 2 of the delay circuit of the initial stage, and the output node 2 of the delay circuit of the final stage is connected to the input node 1 of the delay circuit of the initial stage.

When the delay circuits are connected in this manner, an operation similar to that of the first embodiment can be realized, and a similar effect can be obtained.

Moreover, the constitution of the voltage controlled oscillator is not limited to the circuit constitution described in the first and second embodiments, and can be variously modified. Further, concrete examples of each circuit constitution will be described as modification examples of the first and second embodiments with reference to the drawings.

FIG. 12A is a circuit diagram of the delay circuit according to a first modification example of the first and second embodiments.

As shown in FIG. 12A, in the delay circuit 20 according to the present modification example, the differential feedback circuits 24-1, 24-2 are realized by resistance elements R20 (first resistance element) and R21 (second resistance element), respectively. Even if the resistance elements are used in this manner, the differential operations of the inverter circuits 21-1, 21-2 can be assured. That is, the differential feedback circuits 24-1, 24-2 are not limited as long as the input node of the inverter circuit 21-1 and the output node of the inverter circuit 21-2, or the output node of the inverter circuit 21-1 and the input node of the inverter circuit 21-2 can be set to have the same phase and potential.

Figure 12B:
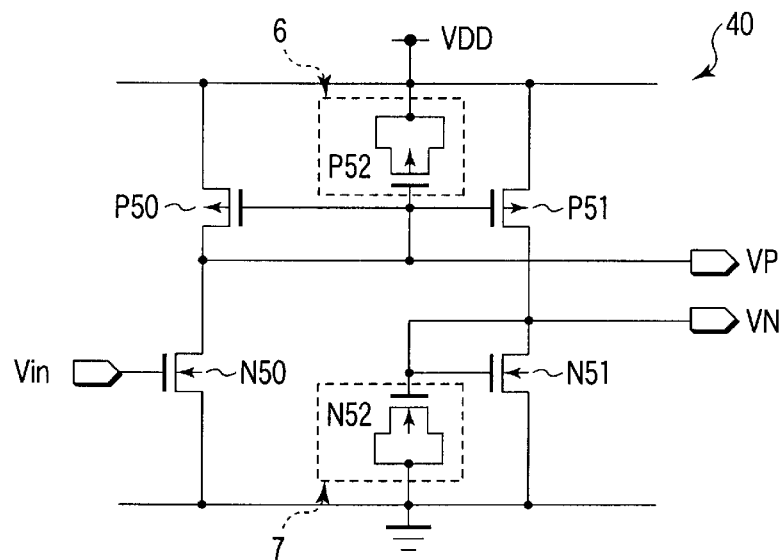
FIG. 12B is a circuit diagram of the oscillation control circuit according to a modification example of the first and second embodiments of the present invention.

FIG. 12B is a circuit diagram of the oscillation control circuit according to a second modification example of the first and second embodiments.

As shown in FIG. 12B, the capacitor element C10 of the oscillation control circuit 40 is replaced with a pMOS transistor P52 in which the source and drain are short-circuited. The pMOS transistor P52 has a source and drain connected to the VDD node, and a gate connected to the gates of the pMOS transistors P50, P51 and VP node. Moreover, the pMOS transistor P52 functions as the capacitor element in which the node with the short-circuited source and drain constitutes one electrode and the gate constitutes the other electrode. The capacitor element C11 is similarly replaced with an nMOS transistor N52 in which the source and drain are short-circuited. That is, the capacitor elements C10, C11 shown in FIG. 6B are not limited as long as the element that cuts a direct-current component and passes an alternating-current component, such as an element having capacitive impedance.

Figure 12C:
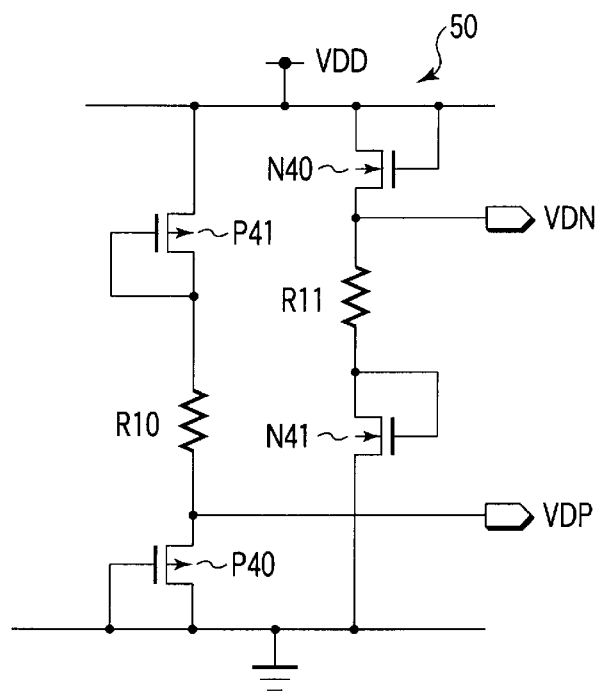
FIG. 12C is a circuit diagram of the amplitude control circuit according to a modification example of the first and second embodiments of the present invention.

Furthermore, FIG. 12C is a circuit diagram of the amplitude control circuit according to a third modification example of the first and second embodiments.

As shown in FIG. 12C, the amplitude control circuit 50 according to the present modification example further includes a pMOS transistor P41 disposed between the VDD node and the resistance element R10, and an nMOS transistor N41 disposed between the GND node and the resistance element R11. The pMOS transistor P41 has a gate and drain connected to one end of the resistance element R10, and a source connected to the VDD node. Moreover, the nMOS transistor N41 has a gate and drain connected to one end of the resistance element R11, and a source connected to the GND node. In this constitution, resistance values of the resistance elements R10, R11 can be reduced. As a result, since sizes of the resistance elements R10, R11 can be reduced, the manufacturing cost can be reduced.

Figure 12D:
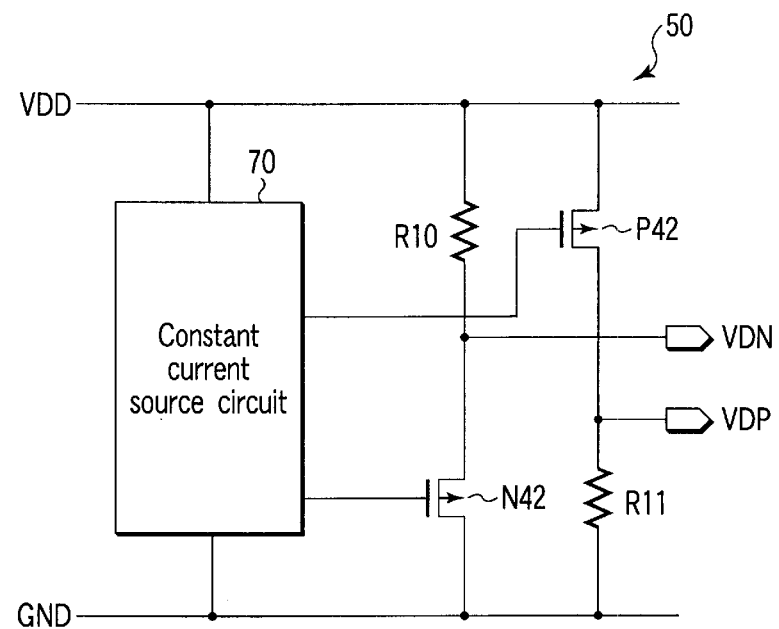
FIG. 12D is a circuit diagram of the amplitude control circuit according to a modification example of the first and second embodiments of the present invention.

Moreover, FIG. 12D is a circuit diagram of the amplitude control circuit according to a fourth modification example of the first and second embodiments.

As shown in FIG. 12D, the amplitude control circuit 50 has a constant current source circuit 70, nMOS transistor N42, pMOS transistor P42, and resistance elements R10, R11. The pMOS transistor P42 has a gate connected to the output node of the constant current source circuit 70, a source connected to the GND node, and a drain. The nMOS transistor N42 has a gate connected to the output node of the constant current source circuit 70, a source connected to the VDD node, and a drain. The resistance element R10 has one end connected to the VDD node, and the other end connected to the drain of the nMOS transistor N42. The resistance element R11 has one end connected to the GND node, and the other end connected to the drain of the pMOS transistor P42. Moreover, the connection node of the drain of the nMOS transistor N42 and the other end of the resistance element R10 is the control potential VDN node, and the connection node of the drain of the pMOS transistor P42 and the other end of the resistance element R11 is the control potential VDP node.

Figure 12E:
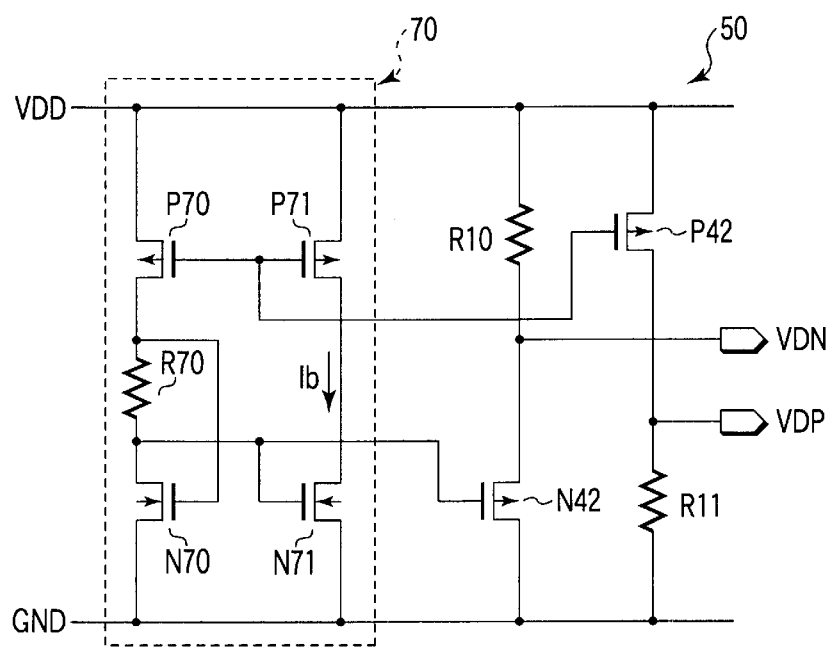
FIG. 12E is a circuit diagram of the amplitude control circuit according to a modification example of the first and second embodiments of the present invention.

FIG. 12E is a circuit diagram of the constant current source circuit 70 embodied in the amplitude control circuit.

As shown in FIG. 12E, the constant current source circuit 70 includes pMOS transistors P70, P71, nMOS transistors N70, N71, and resistance element R70. The pMOS transistor P70 has a source connected to the VDD node, a gate, and a drain. The pMOS transistor P71 has a gate connected to the gate of the pMOS transistor P70, a source connected to the VDD node, and a drain connected to the gate. The nMOS transistor N70 has a gate connected to the drain of the pMOS transistor P70, a source connected to the GND node, and a drain. The nMOS transistor N71 has a gate connected to the drain of the nMOS transistor N70, a drain connected to the GND node, and a source connected to the GND node. The resistance element R70 has one end connected to the drain of the pMOS transistor P70, and the other end connected to the drain of the nMOS transistor N70. Moreover, the drain of the pMOS transistor P71 is one output node of the constant current source circuit 70, and the output node is connected to the gate of the pMOS transistor P42. Furthermore, the gate of the nMOS transistor N71 is the other output node of the constant current source circuit 70, and the output node is connected to the gate of the nMOS transistor N42.

As described above, the constant current source circuit 70 is a self-bias circuit, and has a characteristic that a current value Ib generated by the present circuit increases with a temperature rise, and decreases with a temperature drop. The current Ib is supplied to the resistance elements R10, R11 via a current mirror. Moreover, a potential obtained by subtracting a voltage drop in the resistance element R10 from the power source potential VDD is the control potential VDN, and a potential obtained by adding the ground potential GND and the voltage drop in the resistance element R11 is the control potential VDP. As described above, the current Ib supplied by the constant current source circuit 70 changes in proportion to temperature. For example, Ib increases with the temperature rise. Then, since the voltage drop amounts in the resistance elements R10, R11 also increase, the control potential VDN drops, and the control potential VDP rises. Since the drop of the control potential VDN and the rise of VDP contribute to the increase of amplitude of the delay circuit, the delay time is shortened. As a result, the drop of the operation speed of the delay circuit due to the temperature rise is compensated by the control potentials VDN, VDP, and the change of the delay time due to temperature can be inhibited. According to the constitution of the present amplitude control circuit, the operation of the constant current source circuit 70 has a high sensitivity to the temperature, and conversely the sensitivity to the temperature of the operation of the delay time is lowered. That is, dependency of the delay time upon the temperature can be eliminated, and the delay time can be stabilized with respect to temperature.

Moreover, the oscillation section 5 in FIG. 1 is not limited to an oscillator constituted of a plurality of stages of delay circuits as described above in the embodiments, and may be, for example, an oscillation circuit in which a multi-vibrator is used. FIG. 13A is a circuit diagram of the oscillation section 5 including an oscillation circuit of a multi-vibrator type, and shows a connection of the oscillation section 5 and current sources 3, 4. Moreover, FIG. 13B is a waveform diagram of an oscillation signal outputted by the oscillation section 5.

As shown in FIG. 13A, the oscillation section 5 includes switches SW1, SW2, comparators 80, 81, R/S flip-flop 82, inverter 85, and capacitor element C80. The switch SW1 has one end connected to the current source 3, and the other end connected to one end of the switch SW2. The other end of the switch SW2 is connected to the current source 4. Moreover, the switch SW2 is controlled by an output signal of the R/S flip-flop 82, and the switch SW1 is controlled by the output signal of the R/S flip-flop reversed by the inverter 85. Furthermore, the switch is changed to an ON state when the control signal is a "High" level. Therefore, either one of the switches SW1, SW2 is constantly in the on state. Moreover, the capacitor element C80 is disposed between the connection node of the switches SW1, SW2 and the GND node. The comparator 80 has a inverted input terminal connected to the connection node of the switches SW1, SW2, and a non-inverted input terminal to which a reference voltage VH is inputted. Moreover, the comparator 81 has a inverted input terminal connected to the connection node of the switches SW1, SW2, and a non-inverted input terminal to which a reference voltage VL is inputted. Additionally, the reference voltages VH, VL have a relation of VDD>VH>VL>GND. Output signals of the comparators 80, 81 are inputted into the R/S flip-flop 82. The R/S flip-flop 82 includes an NOR gate 83 having one input terminal connected to the output node of the comparator 80 and the other input terminal connected to the output node of the R/S flip-flop, and an NOR gate 84 having one input terminal connected to the output node of the comparator 81, the other input terminal connected to the output node of the NOR gate 83, and an output end constituting the output node of the R/S flip-flop 82. The oscillation signal is generated by switching the switches SW1, SW2 using the output signal of the R/S flip-flop 82.

The oscillation signal generated in the oscillation circuit in which the multi-vibrator constituted as described above is used has a triangular wave shown in FIG. 13B. The amplitude of the oscillation signal is basically determined by the reference voltages VH, VL applied to the forward input terminals of the comparators 80, 81, and controlled to be between the power source potential VDD and the ground potential GND. Moreover, since the current sources 3, 4 are disposed between the switches SW1, SW2, and the VDD node and GND node, the power source system noise can be prevented from being mixed via the switches SW1, SW2.

An effect described above the embodiments can be obtained in this manner even with the oscillation circuit in which the multi-vibrator is used.

Additionally, the voltage controlled oscillator is operated on the basis of the power source potential VDD in the first and second embodiments and the modification example, but it is possible to reverse the conductive type of the transistor and thereby operates on the basis of the ground potential.

Moreover, the voltage controlled oscillator described in the first and second embodiments and modification example is constituted of: the delay circuit including the inverter circuit, amplitude upper/lower limit circuit, voltage controlled current source, and differential feedback circuit; the oscillation control circuit; the amplitude control circuit; and the output level conversion circuit. However, it is unnecessary to dispose all the elements. For example, the differential feedback circuit in the delay circuit may be omitted. The voltage controlled oscillator may be constituted in this manner as the occasion demands.

Furthermore, the capacitor element has been described as the example of the first and second fluctuation transmission means 6, 7, but of course the means is not limited to the capacitor element. Moreover, in the aforementioned embodiment, the concrete circuit constituting the voltage controlled oscillator have been described with respect to the delay circuit including the inverter circuit, amplitude upper/lower limit circuit, voltage controlled current source, and differential feedback circuit, the oscillation control circuit, and the amplitude control circuit. However, the circuit constitution is not limited as long as a similar action is obtained.

A voltage controlled oscillator according to a third embodiment of the present invention will next be described with reference to FIG. 14. FIG. 14 is a block diagram of a disc playback apparatus.

As shown in FIG. 14, a disc playback apparatus 100 includes a playback section 110, DSP 120, memory 130, CPU 140, voltage controlled oscillator (VCO) 150, and voltage generation circuit 160.

The playback section 110 reads a data from a disc 170. The disc 170 may be, for example, a CD-ROM, CD-R, or DVD. Moreover, a digital signal obtained from the disc 170 is supplied to the DSP 120.

The DSP 120 decodes the digital signal sent from the playback section 110. Moreover, the decoded data is converted to an analog stereo signal, and outputs to a speaker (not shown).

The memory 130 stores a data in the disc obtained by decoding the digital signal by the DSP 120. The memory 130 is, for example, a semiconductor memory such as a static random access memory (SRAM).

The CPU 140 controls operations of the playback section 110 and DSP 120 in accordance with operation of an operation panel (not shown) by a user.

The voltage controlled oscillator 150 generates an internal clock CLK for controlling operations of the DSP 120 and CPU 140. The voltage controlled oscillator 150 has a constitution described in the first and second embodiments, and CKout in the first and second embodiments constitutes the internal clock CLK.

The voltage generation circuit 160 generates an internal voltage Vin. The internal voltage Vin determines the frequency of the internal clock CLK generated by the voltage controlled oscillator 150.

With the aforementioned disc playback apparatus, the internal clock CLK generated by the voltage controlled oscillator 150 is not easily influenced by the noise coming from the VDD node and GND node. Therefore, the frequency of the internal clock CLK has stable frequency determined by the internal voltage Vin. Therefore, the operations of the DSP 120, CPU 140, and the like operated with the internal clock CLK are also stabilized. As a result, operation reliability of the disc playback apparatus is enhanced.

Additionally, the disc playback apparatus has been described in the present embodiment, but of course a similar effect is obtained from semiconductor apparatus including other voltage controlled oscillators.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage controlled oscillator comprising:
    an oscillation controller constituted to generate first and second control potentials corresponding to an input voltage;
    first and second current sources configured to generate control currents corresponding to said first and second control potentials, respectively;
    an oscillation section, connected to a power source potential node via said first current source and connected to a ground potential node via said second current source, said oscillation section generating a clock whose oscillation frequency is determined by said control current;
    a first fluctuation transmitter, disposed between said power source potential node and said first control potential node, said first fluctuation transmitter transmitting a potential fluctuation generated in said power source potential node to said first control potential node at the same phase and maintaining a potential difference between the power source potential and the first control potential to be constant; and
    a second fluctuation transmitter, disposed between said ground potential node and said second control potential node, said second fluctuation transmitter transmitting the potential fluctuation generated in said ground potential node to said second control potential node at the same phase and maintaining the potential difference between the ground potential and the second control potential to be constant.

2. The voltage controlled oscillator according to claim 1, wherein said first and second fluctuation transmitters include capacitive elements.

3. The voltage controlled oscillator according to claim 1, wherein said oscillation section includes a delay circuits each having a power source terminal and a ground terminal, said first current source is disposed between the power source terminal of said each delay circuit and said power source potential node, and said second current source is disposed between the ground terminal of said each delay circuit and said ground potential node.

4. The voltage controlled oscillator according to claim 3, wherein each of said first and second current sources is a part of said delay circuit, and is disposed for each delay circuit.

5. The voltage controlled oscillator according to claim 3, wherein said delay circuit includes first and second inverter circuits each having a power source terminal and a ground terminal, said first and second inverter circuits output reverse signals of input signals after a delay time corresponding to the control currents generated by said first and second current sources, respectively, said first current source is disposed between the power source terminals of said first and second inverter circuits and said power source potential node, and said second current source is disposed between the ground terminals of the first and second inverter circuits and said ground potential node.

6. The voltage controlled oscillator according to claim 5, wherein said delay circuit further includes:
    a first differential feedback circuit, disposed between an input node of said first inverter circuit and an output node of said second inverter circuit, said second differential feedback circuit maintaining the potentials of the input node of said first inverter circuit and the output node of said second inverter circuit at the same phase and the same potential; and
    a second differential feedback circuit, disposed between the output node of said first inverter circuit and the input node of said second inverter circuit, said second differential feedback circuit maintaining the potentials of the output node of said first inverter circuit and the input node of said second inverter circuit at the same phase and the same potential.

7. The voltage controlled oscillator according to claim 5, further comprising: an amplitude upper/lower limit circuit configured to determine an upper limit and a lower limit of the potential of the output node of said first and second inverter circuits.

8. The voltage controlled oscillator according to claim 7, further comprising: an amplitude control circuit configured to control an upper limit value and a lower limit value of the potential of the output node of said first and second inverter circuits limited by said amplitude upper/lower limit circuit.

9. The voltage controlled oscillator according to claim 8, wherein said amplitude control circuit generates third and fourth control potentials and supplies the third and fourth control potentials to said amplitude upper/lower limit circuit, and
    said amplitude upper/lower limit circuit generates a current path between the output node and the ground potential node when the potential of the output node of said first and second inverter circuits rises, and thereby inhibits the potential of the output node from rising to a potential higher than a fixed potential corresponding to said third control potential, and generates the current path between the output node of said first and second inverter circuits and the power source potential node when the potential of the output node drops, and thereby inhibits the potential of the output node from dropping to a potential lower than a fixed potential corresponding to said fourth control potential.

10. The voltage controlled oscillator according to claim 1, wherein said oscillation section includes n delay circuits (n being a natural odd number of 3 or more) each having a power source terminal and a ground terminal and connected in series with one another, said each delay circuit including first and second inverter circuits each having a power source terminal and a ground terminal, said first and second inverter circuits output reverse signals of input signals after a delay time corresponding to said control current, said first current source is disposed between the power source terminals of said first and second inverter circuits and said power source potential node, said second current source is disposed between the ground terminals of the first and second inverter circuits and said ground potential node, output nodes of said first and second inverter circuits are connected to input nodes of said first and second inverter circuits of said delay circuit of the next stage, and the output nodes of said first and second inverter circuits of the final stage of said delay circuit are connected to the input nodes of said first and second inverter circuits of said delay circuit of the initial stage.

11. The voltage controlled oscillator according to claim 6, wherein said first differential feedback circuit is a first MOS transistor having a gate applied with a voltage not lower than a threshold voltage of said first MOS transistor, one end of a current path connected to the input node of said first inverter circuit, and the other end of the current path connected to the output node of said second inverter circuit; and said second differential feedback circuit is a second MOS transistor having a gate applied with a voltage not lower than a threshold voltage of said second MOS transistor, one end of a current path connected to the output node of said first inverter circuit, and the other end of the current path connected to the input node of said second inverter circuit.

12. The voltage controlled oscillator according to claim 6, wherein said first differential feedback circuit is a first resistance element having one end connected to the input node of said first inverter circuit, and the other end connected to the output node of said second inverter circuit; and said second differential feedback circuit is a second resistance element having one end connected to the output node of said first inverter circuit, and the other end connected to the input node of said second inverter circuit.

13. The voltage controlled oscillator according to claim 5, wherein said first current source is a third MOS transistor which has a gate applied with said first control potential, one end of a current path connected to the power source potential node, and the other end of the current path connected to the power source terminals of said first and second inverter circuits, and which operates in a saturated region;

said second current source is a fourth MOS transistor which has a gate applied with said second control potential, one end of a current path connected to the ground potential node, and the other end of the current path connected to the ground terminals of said first and second inverter circuits, and which operates in the saturated region; and gate potentials of said third and fourth MOS transistors are set so that said current values of control currents generated by the third and fourth MOS transistors are equal to each other.

14. The voltage controlled oscillator according to claim 9, wherein said amplitude control circuit includes:

a fifth MOS transistor having a gate applied with a first bias voltage, one end of the current path connected to the ground potential node, and the other end of the current path;

a third resistance element having one end connected to the other end of the current path of said fifth MOS transistor, and the other end connected to the power source potential node, said third control potential being the potential of a connection node of one end of said third resistance element and the other end of the current path of said fifth MOS transistor;

a sixth MOS transistor having a gate applied with a second bias voltage, one end of the current path connected to the power source potential node, and the other end of the current path; and a fourth resistance element having one end connected to the other end of the current path of said sixth MOS transistor, and the other end connected to the ground potential node, said fourth control potential being the potential of the connection node of one end of said fourth resistance element and the other end of the current path of said sixth MOS transistor.

15. A voltage controlled oscillator comprising:

an oscillation controller configured to generate first and second control potentials corresponding to an input voltage;

first and second current sources configured to generate control currents corresponding to said first and second control potentials, respectively;

an oscillation section, connected to a power source potential node via said first current source and connected to a ground potential node via said second current source, said oscillation section generating a clock whose oscillation frequency is determined by said control current, said oscillation section including a delay circuits each having first and second inverter circuits each having a power source terminal and a ground terminal, in which said first and second inverter circuits output reverse signals of input signals after a delay time corresponding to said control currents generated by said first and second current sources, said first current source is disposed between the power source terminals of said first and second inverter circuits and said power source potential node, and said second current source is disposed between the ground terminals of the first and second inverter circuits and said ground potential node;

an amplitude upper/lower limit circuit configured to determine an upper limit and a lower limit of a potential of an output node of said first and second inverter circuits; and an amplitude control circuit configured to control an upper limit value and a lower limit value of the potential of the output node of said first and second inverter circuits limited by said amplitude upper/lower limit circuit.

16. The voltage controlled oscillator according to claim 15, further comprising:

a first fluctuation transmitter, disposed between said power source potential node and said first control potential node, said first fluctuation transmitter transmitting a potential fluctuation generated in said power source potential node to said first control potential node at the same phase and maintaining a potential difference between the power source potential and the first control potential to be constant; and a second fluctuation transmitter, disposed between said ground potential node and said second control potential node, said second fluctuation transmitter transmitting the potential fluctuation generated in said ground potential node to said second control potential node at the same phase and maintaining the potential difference between the ground potential and the second control potential to be constant.

17. The voltage controlled oscillator according to claim 16, wherein said first and second fluctuation transmitters include capacitive elements.

18. The voltage controlled oscillator according to claim 15, wherein said delay circuit further includes:

a first differential feedback circuit, disposed between the input node of said first inverter circuit and the output node of said second inverter circuit, said first differential feedback circuit maintaining the potentials of the input node of said first inverter circuit and the output node of said second inverter circuit at the same phase and the same potential; and a second differential feedback circuit, disposed between the output node of said first inverter circuit and the input node of said second inverter circuit, said second differential feedback circuit maintaining the potentials of the output node of said first inverter circuit and the input node of said second inverter circuit at the same phase and the same potential.

19. A delay circuit comprising:

first and second inverter circuits each having a power source terminal and a ground terminal, said first and second inverter circuits outputting a reverse signal of an input signal after a delay time;

a first current source, disposed between the power source terminals of said first and second inverter circuits and a power source potential node, said first current source generating a first control current, which determines said delay time, based on a first control potential applied from the outside and preventing a noise superimposed on said power source potential node from being mixed into said power source terminal;

a second current source, disposed between the ground terminals of said first and second inverter circuits and a ground potential node, said second current source generating a second control current, which determines said delay time together with said first control current, based on a second control potential applied from the outside and preventing a noise superimposed on said ground potential node from being mixed into said ground terminal;

a first fluctuation transmitter, disposed between said power source potential node and said first control potential node, said first fluctuation transmitter transmitting a potential fluctuation generated in said power source potential node to said first control potential node at the same phase and maintaining a potential difference between the power source potential and the first control potential to be constant; and a second fluctuation transmitter, disposed between said ground potential node and said second control potential node, said second fluctuation transmitter transmitting the potential fluctuation generated in said ground potential node to said second control potential node at the same phase and maintaining the potential difference between the ground potential and the second control potential to be constant.

20. The delay circuit according to claim 19, wherein said first and second fluctuation transmitters include capacitive elements.

21. The delay circuit according to claim 19, further comprising:

a first differential feedback circuit, disposed between an input node of said first inverter circuit and an output node of said second inverter circuit, said first differential feedback circuit maintaining the potentials of the input node of said first inverter circuit and the output node of said second inverter circuit at the same phase and the same potential; and a second differential feedback circuit, disposed between the output node of said first inverter circuit and the input node of said second inverter circuit, said second differential feedback circuit maintaining the potentials of the output node of said first inverter circuit and the input node of said second inverter circuit at the same phase and the same potential.

22. The delay circuit according to claim 19, further comprising: an amplitude upper/lower limit circuit constituted to determine an upper limit and a lower limit of the potential of the output node of said first and second inverter circuits.

23. The delay circuit according to claim 22, wherein said amplitude upper/lower limit circuit generates a current path between the output node of said first and second inverter circuits and the ground potential node when the potential of the output node rises, and thereby inhibits the potential of the output node from rising to a potential higher than a constant potential or a more potential, and generates the current path between the output node of said first and second inverter circuits and the power source potential node when the potential of the output node drops, and thereby inhibits the potential of the output node from dropping to a potential lower than a fixed potential.

24. The delay circuit according to claim 22, further comprising: an amplitude control circuit configured to generate third and fourth control voltages, said third and fourth control voltages determining a critical voltage of the output node of said first and second inverter circuits for generating the current path between the output nodes and a ground potential, and a critical voltage of the output node of said first and second inverter circuits for generating the current path between the output nodes and a power source potential in said amplitude upper/lower limit circuit.

25. The delay circuit according to claim 21, wherein said first differential feedback circuit is a first MOS transistor having a gate applied with voltage not lower than a threshold voltage of said first MOS transistor, one end of a current path connected to the input node of said first inverter circuit, and the other end of the current path connected to the output node of said second inverter circuit; and said second differential feedback circuit is a second MOS transistor having a gate applied with voltage not lower than a threshold voltage of said second MOS transistor, one end of a current path connected to the output node of said first inverter circuit, and the other end of the current path connected to the input node of said second inverter circuit.

26. The delay circuit according to claim 21, wherein said first differential feedback circuit is a first resistance element having one end connected to the input node of said first inverter circuit, and the other end connected to the output node of said second inverter circuit; and said second differential feedback circuit is a second resistance element having one end connected to the output node of said first inverter circuit, and the other end connected to the input node of said second inverter circuit.

27. The delay circuit according to claim 19, wherein said first current source is a third MOS transistor which has a gate applied with said first control potential, one end of a current path connected to the power source potential node, and the other end of the current path connected to the power source terminals of said first and second inverter circuits, and which operates in a saturated region;

said second current source is a fourth MOS transistor which has a gate applied with said second control potential, one end of a current path connected to the ground potential node, and the other end of the current path connected to the ground terminals of said first and second inverter circuits, and which operates in the saturated region; and gate potentials of said third and fourth MOS transistors are set so that said current values of control currents generated by the third and fourth MOS transistors are equal to each other.

28. A delay circuit comprising:

first and second inverter circuits each having a power source terminal and a ground terminal, said first and second inverter circuits outputting a reverse signal of an input signal after a delay time;

a first current source, disposed between the power source terminals of said first and second inverter circuits and a power source potential node, said first current source generating a first control current, which determines said delay time, based on a first control potential applied from the outside and preventing a noise superimposed on said power source potential node from being mixed into said power source terminal;

a second current source, disposed between the ground terminals of said first and second inverter circuits and a ground potential node, said second current source generating a second control current, which determines said delay time together with said first control current, based on a second control potential applied from the outside and preventing a noise superimposed on said ground potential node from being mixed into said ground terminal;

an upper/lower limit circuit configured to determine an upper limit and a lower limit of a potential of an output node of said first and second inverter circuits; and an amplitude control circuit configured to control an upper limit value and a lower limit value of the potential of the output node of said first and second inverter circuits limited by said upper/lower limit circuit.

29. The delay circuit according to claim 28, further comprising:

a first fluctuation transmitter, disposed between said power source potential node and said first control potential node, said first fluctuation transmitter transmitting a potential fluctuation generated in said power source potential node to said first control potential node at the same phase and maintaining a potential difference between the power source potential and the first control potential to be constant; and a second fluctuation transmitter, disposed between said ground potential node and said second control potential node, said second fluctuation transmitter transmitting the potential fluctuation generated in said ground potential node to said second control potential node at the same phase and maintaining the potential difference between the ground potential and the second control potential to be constant.

30. The delay circuit according to claim 29, wherein said first and second fluctuation transmitters include capacitive elements.

31. The delay circuit according to claim 28, further comprising:

a first differential feedback circuit, disposed between an input node of said first inverter circuit and an output node of said second inverter circuit, said first differential feedback circuit maintaining the potentials of the input node of said first inverter circuit and the output node of said second inverter circuit at the same phase and the same potential; and a second differential feedback circuit, disposed between the output node of said first inverter circuit and the input node of said second inverter circuit, said second differential feedback circuit maintaining the potentials of the output node of said first inverter circuit and the input node of said second inverter circuit at the same phase and the same potential.

32. A disc playback system comprising:

a voltage controlled oscillator configured to generate an internal clock; and a semiconductor circuit configured to operate in response to said internal clock, said voltage controlled oscillator including:

an oscillation controller configured to generate first and second control potentials corresponding to an input voltage;

first and second current sources configured to generate control currents corresponding to said first and second control potentials, respectively;

an oscillation section, connected to a power source potential node via said first current source and connected to a ground potential node via said second current source, said oscillation section generating said internal clock whose oscillation frequency is determined by said control current;

a first fluctuation transmitter, disposed between said power source potential node and said first control potential node, said first fluctuation transmitter transmitting a potential fluctuation generated in said power source potential node to said first control potential node at the same phase and maintaining a potential difference between the power source potential and the first control potential to be constant; and a second fluctuation transmitter, disposed between said ground potential node and said second control potential node, said second fluctuation transmitter transmitting the potential fluctuation generated in said ground potential node to said second control potential node at the same phase and maintaining the potential difference between the ground potential and the second control potential to be constant.

33. A disc playback system according to claim 32, wherein said semiconductor circuit is digital signal processor or central processing unit.

* * * * *